United States Patent
Rahul et al.

(10) Patent No.: US 8,972,833 B1
(45) Date of Patent: *Mar. 3, 2015

(54) ENCODING AND DECODING OF INFORMATION USING A BLOCK CODE MATRIX

(75) Inventors: Kumar Rahul, Hyderabad (IN); Sri Deepti Pisipati, Hyderabad (IN); Santosh Yachareni, San Diego, CA (US)

(73) Assignee: Xilinx, Inc., San Jose, CA (US)

( * ) Notice: Subject to any disclaimer, the term of this patent is extended or adjusted under 35 U.S.C. 154(b) by 230 days.

This patent is subject to a terminal disclaimer.

(21) Appl. No.: 13/490,269

(22) Filed: Jun. 6, 2012

(51) Int. Cl.
*H03M 13/00* (2006.01)
*G06F 11/00* (2006.01)

(52) U.S. Cl.
USPC .......................................... 714/785; 714/800

(58) Field of Classification Search
CPC ... H03M 13/091; H04L 1/0061; H04L 1/0083
USPC ......... 714/785, 800, 795, 777, 782, 784, 746, 714/752, 758, E11.03, 776; 375/262; 342/373
See application file for complete search history.

(56) References Cited

U.S. PATENT DOCUMENTS

| | | | |
|---|---|---|---|
| 3,644,902 A | 2/1972 | Beausoleil | |
| 3,688,265 A * | 8/1972 | Carter et al. | 714/763 |
| 3,697,949 A * | 10/1972 | Carter et al. | 714/763 |
| 4,547,882 A | 10/1985 | Tanner | |
| 4,736,376 A * | 4/1988 | Stiffler | 714/785 |
| 5,220,568 A * | 6/1993 | Howe et al. | 714/782 |
| 5,381,425 A * | 1/1995 | Bitzer et al. | 714/793 |
| 5,490,155 A | 2/1996 | Abdoo et al. | |
| 5,828,676 A * | 10/1998 | Hurlbut et al. | 714/752 |
| 5,938,773 A * | 8/1999 | Hauck et al. | 714/6.24 |
| 6,429,682 B1 | 8/2002 | Schultz et al. | |
| 6,604,222 B1 * | 8/2003 | Jensen | 714/785 |
| 6,823,470 B2 * | 11/2004 | Smith et al. | 714/4.5 |
| 7,254,800 B1 | 8/2007 | Trimberger | |
| 7,426,678 B1 | 9/2008 | Cory et al. | |
| 7,539,926 B1 | 5/2009 | Lesea | |
| 7,620,873 B2 * | 11/2009 | Kanaoka et al. | 714/752 |
| 8,122,317 B1 | 2/2012 | Clark et al. | |
| 8,359,515 B2 * | 1/2013 | Gunnam | 714/752 |
| 8,806,295 B2 * | 8/2014 | Jagmohan et al. | 714/763 |
| 2006/0156177 A1 | 7/2006 | Kottapalli et al. | |
| 2011/0161773 A1* | 6/2011 | Martwick et al. | 714/755 |
| 2011/0239082 A1 | 9/2011 | Yang | |

OTHER PUBLICATIONS

U.S. Appl. No. 13/078,172, filed Apr. 1, 2011, Lesea et al.
U.S. Appl. No. 13/490,322, filed Jun. 6, 2012, Rahul et al.
Chapman, Ken et al., *SEU Strategies for Virtex-5 Devices*, XAPP864 (v1.0.1), Mar. 5, 2009, pp. 1-29, Xilinx, Inc., San Jose, CA, USA.

(Continued)

*Primary Examiner* — Phung M Chung
(74) *Attorney, Agent, or Firm* — W. Eric Webostad

(57) ABSTRACT

An embodiment of an apparatus for encoding. For this embodiment of the apparatus, an encoder block is coupled to receive input data. The encoder block has an R-matrix block. The R-matrix block is configured to: exclusively OR combinations of subsets of data bits of the input data to generate (n−1) parity bits for n a positive integer greater than zero; and exclusively OR a combination of all of the data bits and all the (n−1) parity bits to generate an (n) parity bit 9-to-7.

14 Claims, 19 Drawing Sheets

(56) References Cited

OTHER PUBLICATIONS

Chapman, Ken, *SEU Strategies for Virtex-5 Devices*, XAPP864 (v2.0), Apr. 1, 2010, pp. 1-16, Xilinx, Inc., San Jose, CA, USA.
Carmichael, Carl et al., *Correcting Single-Event Upsets Through Virtex Partial Configuration*, XAPP216. (v1.0), Jun. 1, 2000, pp. 1-12, Xilinx, Inc., San Jose, CA, USA.
Dutta, Avijit et al., "Multiple Bit Upset Tolerant Memory Using a Selective Cycle Avoidance Based SEC-DED-DAEC Code," *Proc. of the 25th IEEE VLSI Test Symposium*, May 6, 2007, pp. 349-354, IEEE, Piscataway, New Jersey, USA.
Lim, David et al., *Two Flows for Partial Reconfiguration: Module Based or Small Bit Manipulations*, XAPP290 (v1.0), May 17, 2002, pp. 1-23, Xilinx, Inc., San Jose, CA, USA.
ETO, EMI, *Difference-Based Partial Reconfiguration*, XAPP290 (v2.0), Dec. 3, 2007, pp. 1-11, Xilinx, Inc., San Jose, CA, USA.
Tam, Simon, *Single error Correction and Double Error Detection*, XAPP645 (v2.2), Aug. 9, 2006, pp. 1-12, Xilinx, Inc., San Jose, CA, USA.
Xilinx, Inc., *LogiCORE IP Soft Error Mitigation Controller v1.2*, DS796, Dec. 14, 2010, pp. 1-14, Xilinx, Inc., San Jose, CA USA.
Xilinx, Inc., *Virtex-6 FPGA Configuration User Guide*, UG360 (v3.2), Nov. 1, 2010, pp. 1-180, Xilinx, Inc., San Jose, CA, USA.

* cited by examiner

| b1[15] | b0[15] | b1[13] | b0[13] | b1[11] | b0[11] | b1[9] | p6 |
| --- | --- | --- | --- | --- | --- | --- | --- |
| b0[9] | b1[7] | b0[7] | b1[5] | b0[5] | b1[3] | b0[3] | b1[1] |
| b0[1] | b1[14] | b0[14] | b1[12] | b0[12] | b1[10] | b0[10] | b1[8] |
| b0[8] | b1[6] | b0[6] | b1[4] | b0[4] | b1[2] | b0[2] | b1[0] |
| b0[0] | a1[15] | a0[15] | a1[13] | a0[13] | a1[11] | a0[11] | p5 |
| a1[9] | a0[9] | a1[7] | a0[7] | a1[5] | a0[5] | a1[3] | a0[3] |
| a1[1] | a0[1] | a1[14] | a0[14] | a1[12] | a0[12] | a1[10] | p4 |
| a0[10] | a1[8] | a0[8] | a1[6] | a0[6] | a1[4] | a0[4] | p3 |
| a1[2] | a0[2] | a1[0] | a0[0] | p2 | p1 | p0 | |

SYND[0] = a0[6] ^ a0[5] ^ b1[6] ^ b0[2] ^ a1[7] ^ b0[7] ^ a1[5] ^ b1[7] ^
a0[2] ^ a0[9] ^ a1[1] ^ b0[3] ^ a1[10] ^ a1[8] ^ b1[9]  ^ a0[0] ^ b0[0] ^
a0[8] ^ a0[10] ^ b0[13] ^ b0[11] ^ b0[15] ^ a1[12] ^ b1[3] ^ b0[4] ^ b0[14]
^ a1[9] ^ a0[14] ^ a0[15] ^ P0                              ◀ 500

SYND[1] = a0[1] ^ a1[0] ^ a0[11] ^ b0[9] ^ b1[2] ^ a1[2] ^ b1[13] ^
a0[13] ^ b1[14] ^ a0[2] ^ a0[9] ^ a1[1] ^ b0[3] ^ a1[10] ^ a1[8] ^ b1[9] ^
a0[3] ^ a0[4] ^ b0[1] ^ b1[0] ^ b0[6] ^ b1[4] ^ b1[10] ^ b0[12] ^ a1[3] ^
a1[6] ^ a0[12]  ^ b1[3] ^ b0[4] ^ b0[14] ^ a1[9] ^ a0[14] ^ a0[15] ^ P1   ◀ 501

SYND[2] = a0[7] ^ b0[5] ^ b1[8] ^ b0[10] ^ b0[8] ^ b1[1] ^ a1[13] ^ b1[5]
^ b1[15] ^ a0[0] ^ b0[0] ^ a0[8] ^ a0[10] ^ b0[13] ^ b0[11] ^ b0[15] ^
a1[12]  ^ a0[3] ^ a0[4] ^ b0[1] ^ b1[0] ^ b0[6] ^ b1[4] ^ b1[10] ^ b0[12] ^
a1[3] ^ a1[6] ^ a0[12]  ^ b1[3] ^ b0[4] ^ b0[14] ^ a1[9] ^ a0[14] ^ a0[15] ^
P2                                                           ◀ 502

SYND[3] = a0[4] ^ b0[0]  ^ a0[1] ^ a0[6] ^ b1[3] ^ b0[1] ^ a0[10] ^ a0[9]
^ a0[11]  ^ a1[14]  ^ b0[6] ^ b1[8] ^ b0[3] ^ b1[6] ^ a1[4]   ^ b0[4] ^
b1[4] ^ b0[8] ^ b1[14] ^ b0[2] ^ b1[12]  ^ b0[14] ^ b0[7] ^ a1[15] ^ b1[10]
^ a1[13]  ^ b1[7] ^ a0[15]  ^ a1[9] ^ b0[15] ^ b1[5] ^ b1[9] ^ a1[6] ^ P3   ◀ 503

SYND[4] = a0[8] ^ a0[7]  ^ a1[0] ^ a0[5]  ^ b1[3] ^ b0[1] ^ a0[10] ^
a0[9]  ^ a0[11] ^ a1[14]  ^ b0[10] ^ a1[10] ^ b1[2] ^ a0[12] ^ a0[14]  ^
b0[4] ^ b1[4] ^ b0[8] ^ b1[14] ^ b0[2] ^ b1[12]  ^ b1[15] ^ b0[11] ^ a1[8]
^ a1[2] ^ a1[5] ^ a1[11]  ^ b1[10] ^ a1[13]  ^ b1[7] ^ a0[15]  ^ a1[3] ^
a1[12] ^ b1[11]  ^ a1[6] ^ P4                                ◀ 504

SYND[5]  = b1[0] ^ b0[13] ^ b0[5] ^ a1[1] ^ b0[9]  ^ b0[6] ^ b1[8] ^
b0[3]  ^ b1[6]  ^ a1[4]   ^ b0[10] ^ a1[10] ^ b1[2] ^ a0[12] ^ a0[14]  ^
b0[4] ^ b1[4] ^ b0[8] ^ b1[14] ^ b0[2]  ^ b1[12]  ^ b0[12] ^ b1[13] ^ a1[9]
^ b0[15] ^ b1[5] ^ b1[9]  ^ a1[3] ^ a1[12] ^ b1[11]  ^ a1[6] ^ P5           ◀ 505

SYND[6]  = b1[1] ^ a1[7] ^ a0[13]  ^ b0[14] ^ b0[7] ^ a1[15] ^ b1[15] ^
b0[11] ^ a1[8]  ^ a1[2] ^ a1[5] ^ a1[11]  ^ b1[10] ^ a1[13]  ^ b1[7] ^ a0[15]
^ b0[12]  ^ b1[13] ^ a1[9] ^ b0[15] ^ b1[5] ^ b1[9]  ^ a1[3]  ^ a1[12]  ^
b1[11]  ^ a1[6] ^ P6                                         ◀ 506

SYND[7] = ( ^a0[15:0] ) ^  ( ^b0[15:0] )  ^  ( ^a1[15:0] ) ^  ( ^b1[15:0] ) ^
P0 ^ P1 ^  P2 ^ P3 ^  P4 ^  P5 ^  P6 ^ P7                    ◀ 507

Actual data, 64 bit in hex: e6ed508b01084a8a ⌒2201

Actual data in binary: ⌒2202
1110011011101101010100001000101100000001000010000100101010001010

8 bit Parity for the above data: 0111 1100   (p7 p6 p5 p4 p3 p2 p1 p0) ⌒2203

72 bit data (64+8) after encoding in hex: 737b5438b01c21288a ⌒2204

72 bit data (64+8) after encoding in binary:
011100110111101101010100001110001011000000011100001000010010100010001010
2205

Error in 1st bit position: 72'h737b5438b01c21288a ^ 72'h00_0000_0000_0000_0001 ⌒2301

New error data: 72'h737b5438b01c21288b ⌒2302

Syndrome of the error data:
1000 0101. ( synd[7] synd[6] synd[5] synd[4] synd[3] synd[2] synd[1] synd[0] ) ⌒2303

Flip the bit position a0[0]. ⌒2304

Corrected data: e6ed508b01084a8a ⌒2305

Error in 1st and 2nd bit positions: 72'h737b5438b01c21288a ^ 72'h00_0000_0000_0000_0003 ⌒2311

New error data: 72'h737b5438b01c212889 ⌒2312

Syndrome of the error data: 0000 1111 ⌒2313

Flip the bit position a0[0] , a0[1] . ⌒2314

Corrected data: e6ed508b01084a8a ⌒2315

FIG. 23-2

Error injection in 1st, 2nd and 3rd bit positions: ⌐2321
    72'h737b5438b01c21288a ^ 72'h00_0000_0000_0000_0007

New error data: 72'h737b5438b01c21288d ⌐ 2322

Syndrome of the error data: 1000 1100 ⌐ 2323

3-adjacent bit error detected ⌐ 2324

FIG. 23-3

Actual data, 64 bit in hex: 64'hb66d30a3010c541e ⌐ 2401

Actual data in binary: ⌐ 2402
    64'h1011011001101101001100001010001100000001000011000101010000011110

8 bit Parity for the above data: 0100 1110 ⌐ 2403

72 bit data (64+8) after encoding in hex: 72'h5b5b4c0a301c31521e ⌐ 2404

72 bit data (64+8) after encoding in binary:
    72'h111110110001101001001000000010000110000000011000001100000101000100101110
                                                                              ⌐ 2405

FIG. 24

Error in 5th bit position: 72'h5b5b4c0a301c31521e ^ 72'h00_0000_0000_0000_0005 ⌐ 2501

New error data: 72'h5b5b4c0a301c31520e ⌐ 2502

Syndrome of the error data: 1000 1110 ⌐ 2503

Flip the bit position a0[4]. ⌐ 2504

Corrected data: b66d30a3010c541e ⌐ 2505

FIG. 25-1

Error in 5th and 6th bit positions:     ⎯2511
       72'h5b5b4c0a301c31521e ^ 72'h00_0000_0000_0000_0030

New error data: 72'h5b5b4c0a301c31522e ⎯2512

Syndrome of the error data: 0001 1111 ⎯2513

Flip the bit position a0[4], a0[5] ⎯2514

Corrected data: b66d30a3010c541e ⎯2515

FIG. 25-2

Error injection in 5th, 6th & 7th bit positions: ⎯2521
       72'h5b5b4c0a301c31521e ^ 72'h00_0000_0000_0000_0070

New error data: 72'h5b5b4c0a301c31526e ⎯2522

Syndrome of the error data: 1001 0110 ⎯2523

3-adjacent bit error detected ⎯2524

FIG. 25-3

ENCODING AND DECODING OF INFORMATION USING A BLOCK CODE MATRIX

FIELD OF THE INVENTION

An embodiment relates to integrated circuit devices ("ICs"). More particularly, an embodiment relates to encoding and decoding of information for an IC.

BACKGROUND

As memory bit cells of an IC get smaller and/or denser, the likelihood of a Single Event Upset ("SEU") impacting more than one of such memory bit cells at a time increases. However, increasing too is a demand for memory bandwidth, and thus the addition of more parity bits to resolve data corruption issues through use of an Error-Correcting Code ("ECC") would hamper efforts to satisfy such demand for memory bandwidth. Accordingly, it would be desirable and useful to provide an ECC that addresses both of these conflicting issues.

SUMMARY

One or more embodiments generally relate to the encoding and decoding of information for an IC.

An embodiment relates generally to an apparatus. In such an embodiment, an encoder block is coupled to receive input data. The encoder block has a first R-matrix block. The first R-matrix block is configured to: exclusively OR combinations of subsets of data bits of the input data to generate (n−1) parity bits for n a positive integer greater than zero; and exclusively OR a combination of all of the data bits and all the (n−1) parity bits to generate an (n) parity bit.

In various other embodiments of the embodiment described in the preceding paragraph, such apparatus may further include one or more of the following. A decoder can have a second R-matrix block. The second R-matrix block can be configured to exclusively OR the combinations of the subsets of the data bits respectively with an associated parity bit of the (n−1) parity bits to generate (n−1) syndrome bits. The second R-matrix block can be configured to exclusively OR the combination of all of the data bits and all the (n−1) parity bits to generate an (n) syndrome bit. The decoder can be configured to: detect no bit in error; detect and correct a single bit error; detect a double bit error; detect and correct a double adjacent bit error; and detect a triple adjacent bit error. The second R-matrix block can have a first syndrome, a second syndrome, and a third syndrome. The first syndrome, the second syndrome, and the third syndrome can be respectively associated with a single bit error space, a two adjacent bit error space, and a three adjacent bit error space. The first syndrome and the second syndrome can be configured to share a first common space. The first syndrome and the third syndrome can have mutually exclusive signatures. The third syndrome and the second syndrome can be configured to share a second common space. The decoder can be configured to provide a single bit error status, a double adjacent bit error status, and a triple adjacent bit error status. The first R-matrix block can be configured to provide encoded data by arrangement of the data bits and the (n−1) parity bits in an R-matrix format. The R-matrix format can include almost twice a number of rows with a same number of columns with respect to a Hamming Code configuration of the input data and the parity data. The R-matrix format can have approximately a 9-to-7 ratio of occupied cells to unoccupied cells.

An embodiment relates generally to an encoder. In such an embodiment, an R-matrix block is configured to generate parity data for input data. The R-matrix block is further configured to: arrange the input data as associated with a matrix format having approximately a 9-to-7 ratio of occupied cells to unoccupied cells; distribute the input data throughout the matrix format in an out-of-sequence order; and populate the matrix format with the parity data generated.

In various other embodiments of the embodiment described in the preceding paragraph, such apparatus may further include one or more of the following. The matrix format can include increasing a number of rows while maintaining a number of columns with respect to a Hamming Code configuration of the input data and the parity data, where the parity data does not change location with respect to the Hamming Code configuration. Distribution of the input data throughout the matrix format can include: sets of data bits of the input data in sequences with at least one parity bit of the parity data placed in the middle of each of the sequences to provide singleton bits; two adjacent bits of each of the sequences paired to provide bit pairs; and three adjacent bits of each of the sequences of singleton bits concatenated to provide bit triplets. Distribution of the input data throughout the matrix format can include two associated parity bits of the parity data placed in each of a plurality of sets of the input data to provide singleton bits, where: the input data can be in sequences of data bits; the two associated parity bits for a first subset of the sequences of data bits can both be placed in a middle of an associated sequence of the sequences; and the two associated parity bits for a second subset of the sequences of data bits can have one of the two associated parity bits placed in the middle of the associated sequence and another one of the two associated parity bits placed at an end of the associated sequence. Distribution of the input data throughout the matrix format can include: two adjacent bits of each of the sequences can be paired to provide bit pairs; and three adjacent bits of each of the sequences of singleton bits can be concatenated to provide bit triplets.

An embodiment relates generally to another apparatus. In such an embodiment, a decoder is coupled to a memory to receive encoded data. The decoder is configured to generate syndrome information from the encoded data, and decode the encoded data to provide decoded data. The decoder is further configured to detect and correct a double adjacent bit error, and detect a triple adjacent bit error.

In various other embodiments of the embodiment described in the preceding paragraph, such apparatus may further include one or more of the following. The matrix format can include doubling a number of rows while maintaining a number of columns with respect to a Hamming Code configuration of the input data and the parity data, where the parity data does not change location with respect to the Hamming Code configuration. Distribution of the input data throughout the matrix format can include: sets of data bits of the input data in sequences with at least one parity bit of the parity data placed in the middle of each of the sequences to provide singleton bits; two adjacent bits of each of the sequences paired to provide bit pairs; and three adjacent bits of each of the sequences of singleton bits concatenated to provide bit triplets. Distribution of the input data throughout the matrix format can include two associated parity bits of the parity data placed in each of a plurality of sets of the input data to provide singleton bits, where: the input data can be in sequences of data bits; the two associated parity bits for a first subset of the sequences of data bits can both be placed in a middle of an associated sequence of the sequences; and the two associated parity bits for a second subset of the sequences of data bits can have one of the two associated parity bits placed in the middle of the associated sequence and another one of the two associated parity bits placed at an end of the associated sequence. Distribution of the input data throughout the matrix format can include: two adjacent bits of each of the sequences can be paired to provide bit pairs; and three adjacent bits of each of the sequences of singleton bits can be concatenated to provide bit triplets.

An embodiment relates generally to another apparatus. In such an embodiment, a decoder is coupled to a memory to receive encoded data. The decoder is configured to generate syndrome information from the encoded data, and decode the encoded data to provide decoded data. The decoder is further configured to detect and correct a double adjacent bit error, and detect a triple adjacent bit error.

In various other embodiments of the embodiment described in the preceding paragraph, such apparatus may further include one or more of the following. The decoder can include a matrix function configured to: detect no bit in error; detect and correct a single bit error; detect a double bit error; detect and correct the double adjacent bit error; and detect the triple adjacent bit error. The matrix function can have a first syndrome, a second syndrome, and a third syndrome. The first syndrome, the second syndrome, and the third syndrome can be respectively associated with a single bit error space, a two adjacent bit error space, and a three adjacent bit error space. The first syndrome and the second syndrome can be configured to share a first common space. The first syndrome and the third syndrome can have mutually exclusive signatures. The third syndrome and the second syndrome can be configured to share a second common space. The decoder can be configured to provide a single bit error status, a double adjacent bit error status, and a triple adjacent bit error status. The matrix function can be configured to arrange data bits and parity bits of the encoded data in a matrix format to generate syndrome bits. The matrix function uses a matrix format which can include a significantly greater number of rows with a same number of columns with respect to a Hamming Code configuration of the data bits and the parity bits. The matrix format can have approximately a 9-to-7 ratio of occupied cells to unoccupied cells. The arrangement of the encoded data can include: sets of the data bits in sequences with at least one parity bit of the parity bits placed in the middle of each of the sequences to provide singleton bits; two adjacent bits of each of the sequences paired to provide bit pairs; and three adjacent bits of each of the sequences of singleton bits associated to provide bit triplets. The arrangement of the encoded data can include two associated parity bits of the parity bits placed in each of a plurality of sets of the data bits to provide singleton bits. The input data can be in sequences of the data bits. The two associated parity bits for a first subset of the sequences of the data bits can both be placed in a middle of an associated sequence of the sequences. The two associated parity bits for a second subset of the sequences of the data bits can have one placed in the middle of the associated sequence and another one placed at an end of the associated sequence. The arrangement of the encoded data can include: two adjacent bits of each of the sequences can paired to provide bit pairs; and three adjacent bits of each of the sequences of singleton bits concatenated to provide bit triplets. Generation of the syndrome information from the encoded data can include exclusive OR resources configured to exclusively OR: combinations of subsets of the data bits and an associated parity bit of the parity bits from the matrix format to generate each bit(n−1) syndrome bit for n a positive integer greater than one; and a combination of all of the data bits and all of the parity bits from the encoded data to generate a bit(n) syndrome bit.

BRIEF DESCRIPTION OF THE DRAWINGS

Accompanying drawings show exemplary embodiments. However, the accompanying drawings should not be taken to limit the embodiments shown, but are for explanation and understanding only.

FIG. 2 is a table diagram depicting an exemplary embodiment of a conventional Hamming Code Matrix ("H-matrix").

FIG. 4 is a listing diagram depicting an exemplary embodiment of parity bit equations for the R-matrix of FIG. 3.

FIG. 5 is a listing diagram depicting an exemplary embodiment of syndrome bit equations for the R-matrix of FIG. 3.

FIG. 12 is the table diagram of FIG. 3 depicting an exemplary embodiment of R-matrix for determining a P2 parity bit or a SYND[2] ("S2") syndrome bit.

FIG. 15 is the table diagram of FIG. 3 depicting an exemplary embodiment of R-matrix for determining a P5 parity bit or a SYND[5] ("S5") syndrome bit.

FIG. 16 is the table diagram of FIG. 3 depicting an exemplary embodiment of R-matrix for determining a P6 parity bit or a SYND[6] ("S6") syndrome bit.

FIGS. 22 and 24 are respective flow diagrams depicting examples of encoding using the R-matrix of FIG. 3.

FIGS. 23-1 through 23-3 and 25-1 through 25-3 are respective flow diagrams depicting examples of decoding using the R-matrix of FIG. 3 for the encoding examples of FIGS. 22 and 24, respectively.

DETAILED DESCRIPTION

Figure 1:
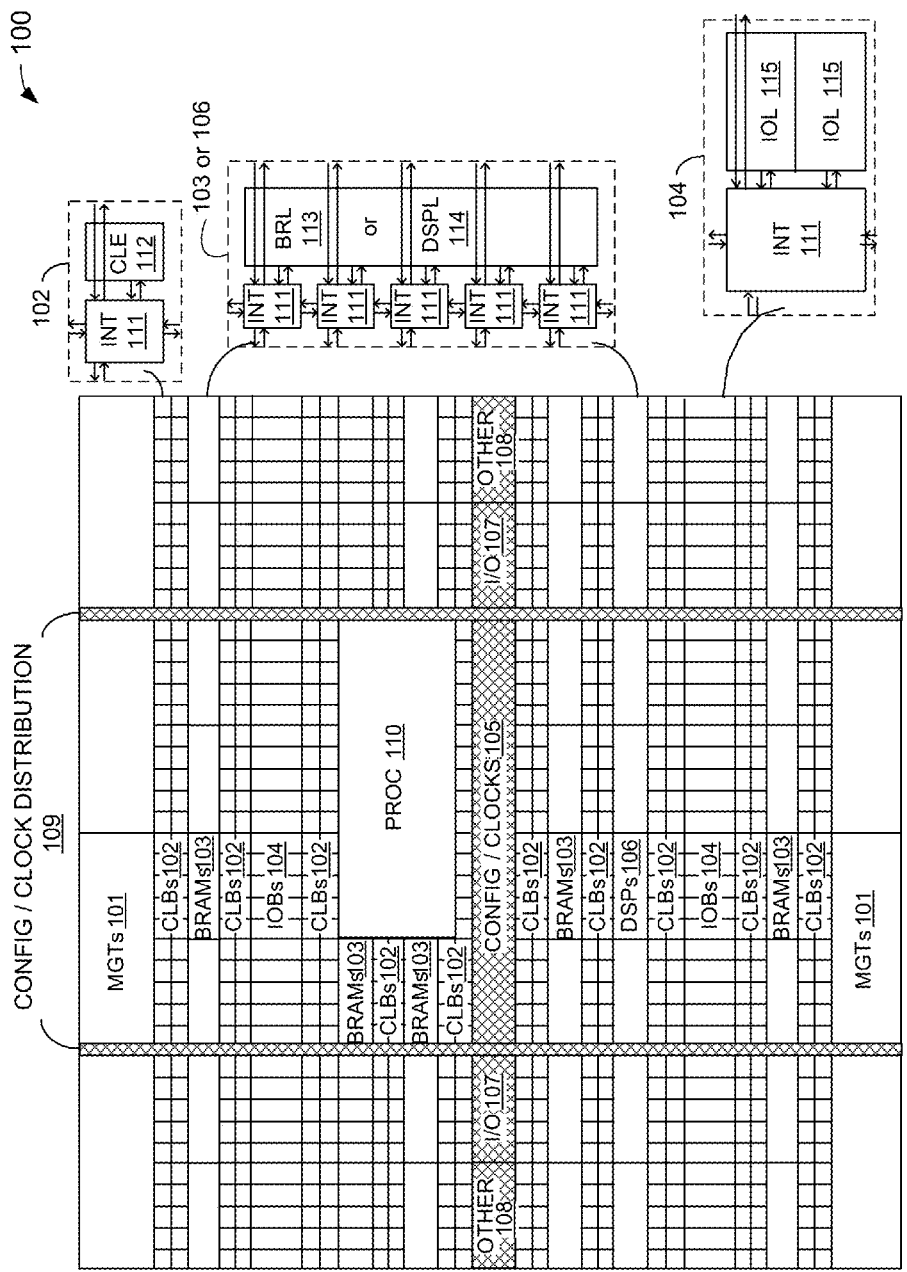
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

There are any of a variety of block codes and sizes of block codes which may be described. Thus, for purposes of clarity by way of example and not limitation, a 64-bit with 8 parity bit Hamming Code configuration, which may be realized as a matrix with x-rows and y-columns, is described. In such a Hamming Code configuration of data bits and parity bits, such an ECC is capable of: detecting no bit in error; detecting and correcting a 1-bit error; and detecting, but not correcting, a 2-bit error. However, as memory bit cells become denser and/or smaller, events upsetting state of such memory bit cells, such as Single Event Upsets, are more likely to corrupt more than two of such memory bit cells at a time.

With the above general understanding borne in mind, various embodiments for detecting and correcting, as well as detecting, more corrupted bits than an equivalently sized Hamming Code configuration are generally described below. More particularly, for a same data bit size and parity bit size as in a Hamming Code configuration, more corrupted bits may be detected. For purposes of clarity by way of example and not limitation, using only 8 parity bits, a 64-bit ECC is described below that allows for: detection of no bit errors; detection and correction of single bit errors; detection and correction of double adjacent bit errors; detection of nonadjacent double bit errors; and detection of triple adjacent bit errors.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

FIG. 2 is a table diagram depicting an exemplary embodiment of a conventional Hamming Code Matrix ("H-matrix") 200. H-matrix 200 in this exemplary embodiment is for 64-bit data. More particularly, there are four sets of 16 bits each, namely bits a0[15:0], a1[15:0], b0[15:0], and b1[15:0]. Additionally, H-matrix 200 includes seven parity bits p0 through p6, and an eighth parity bit not included in H-matrix 200 is used to set overall parity, namely either odd or even parity. Thus, in this example, 64-bit Hamming Error-Correcting Code ("ECC") with 8 parity bits is used.

In this embodiment, H-matrix 200 includes nine rows 210 and eight columns 220 for a total of 72 matrix cells 230. As there are 64 bits of data and 7 bits of parity for a total of 71 bits, one of matrix cells 230 is unoccupied. The unoccupied matrix cell 230 is cell (9, 8), and the p7 parity bit takes that zeroth position, namely cell (9,8) in this example.

Generally, a Hamming Code is used to encode input data into a codeword using H-matrix 200 and then write such codeword into memory. If any Single Event Upset ("SEU") upsets at most a single bit of data stored in such memory, then with an ECC or a forward error correction ("FEC") code, such as a Hamming Code for example, such encoded data may be decoded using H-matrix 200. Additionally, such upset bit, namely the corrupted data bit, may be corrected. Syndromes or check bits generated using H-matrix 200 may be used to detect which bit location is in error and correct it. Furthermore, if two bits are upset, then such error may be detected.

However, H-matrix 200 conventionally cannot detect and correct data having two adjacent bits corrupted, such as by an SEU or other bit-corrupting event. Furthermore, H-matrix 200 conventionally cannot detect a data error having all three adjacent bits corrupted, such as by an SEU or other bit-corrupting event.

Because memory cells are substantially smaller than in the past, the likelihood of an SEU or soft error of multiple adjacent bits may have increased. For example, an integrated circuit exposed to external ionic or electromagnetic radiation may be more likely to have two or more adjacent memory cells affected by such external radiation because memory cells are more densely packed than in the past.

Figure 3:
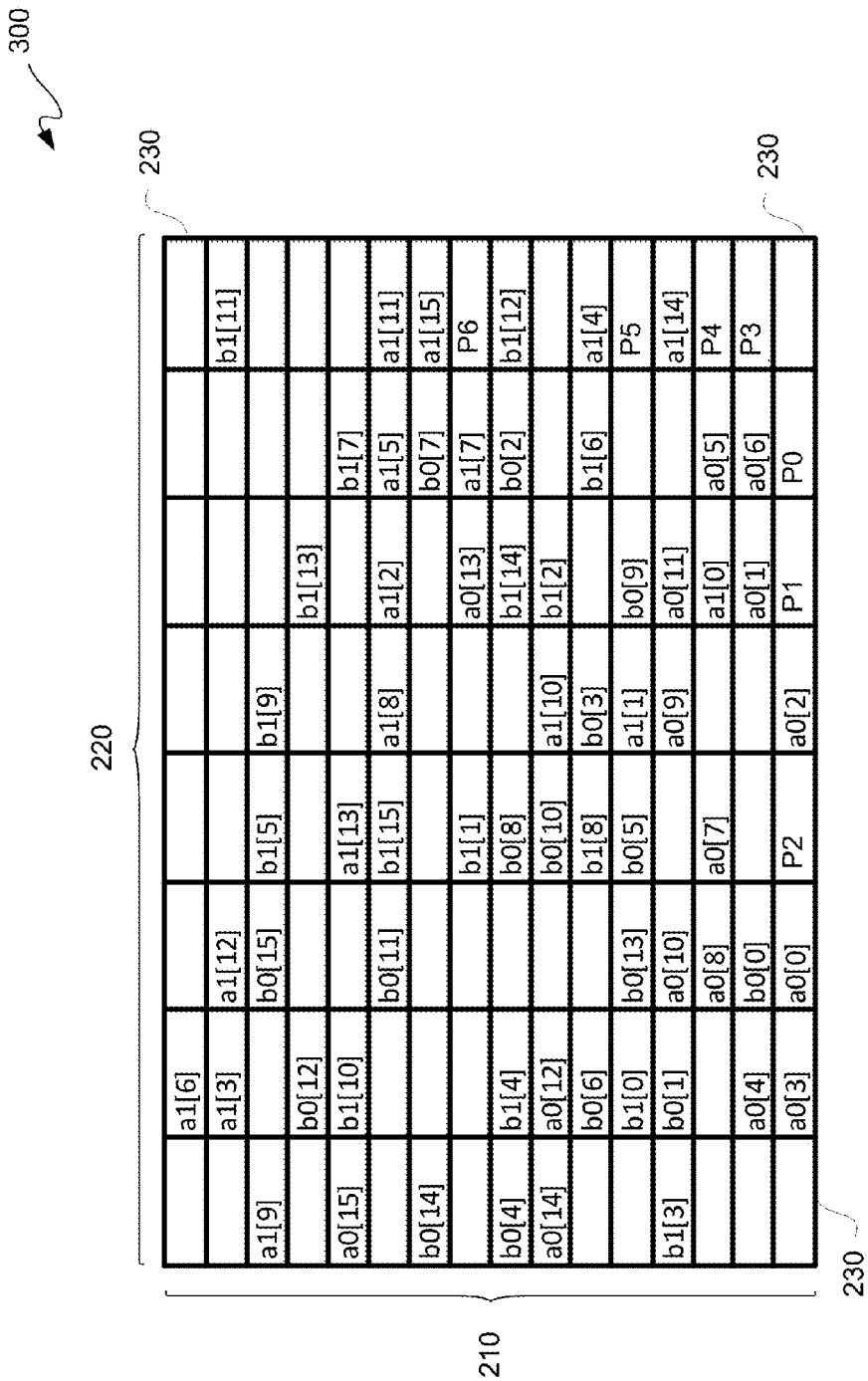
FIG. 3 is a table diagram depicting an exemplary embodiment of a "Rahul Code" matrix ("R-matrix").

FIG. 3 is a table diagram depicting an exemplary embodiment of a "Rahul Code" matrix ("R-matrix") 300. R-matrix 300 is for a block code, as described herein. For purposes of clarity by way of example and not limitation, R-matrix 300 is further described with reference to an 8 parity bit embodiment; however, R-matrix 300 may be used with any block code size. Even though R-matrix 300 is described for writing and reading encoded data from Static Random Access Memory ("SRAM"), such as block RAM ("BRAM") for example, it should be understood that R-matrix 300 may be for writing to and reading from any form of memory. Additionally, R-matrix is not a Hamming Code matrix, namely not an H-matrix, as shall be further appreciated from the following description.

For purposes of clarity by way of example and not limitation, this exemplary embodiment of R-matrix 300 is depicted for 64-bit data; however, fewer or more than 64 data bits may be used, which number of data bits may affect the number of parity bits. Continuing the above example, in this exemplary embodiment, R-matrix 300 has four sets of 16 bits each, namely data bits a0[15:0], a1[15:0], b0[15:0], and b1[15:0]. These four sets of data are distributed in an out-of-sequence order throughout R-matrix 300. Additionally, for this embodiment, R-matrix 300 includes seven parity bits P0 through P6. Also, there is an eighth parity bit P7, which is used to make all bits, namely for this example 64-bit data and parity bits P0 to P6 or 71 bits, to make 72-bit data, namely the 71 bits plus the P7 parity bit, a desired parity. For purposes of clarity by way of example and not limitation, it shall be assumed that overall even parity is used for all 72 bits; even though, in other embodiments overall odd parity may be used.

For example, if a 71-bit count is odd parity, namely a 1, then parity bit P7 will be 1 to make such overall parity even, which information or setting may be used for decoding as described below in additional detail. Furthermore, for example, if a 71-bit count is even parity, namely a 0, then parity bit P7 will be 0 to keep such overall parity even. Thus, parity bit P7 may be used for either an odd or an even parity. Again, by odd parity or even parity, it is generally meant a parity of all data and parity bits. In this example, such parity is determined by bits a0[15:0], a1[15:0], b0[15:0], and b1[15:0] and P0 through P6.

Thus, parity of an encoded word ("codeword") may be set either to a logic 1 ("odd parity") or logic 0 ("even parity") with use of a parity bit, such as parity bit P7 in this example. Along those lines, parity bit P7 may be set to make parity of a codeword either odd or even. Parity bits P0 through P7 are generated by an encoder, and parity bit P7 may be stored in association with a codeword, including in a same block of memory as the codeword with which it is associated.

In this embodiment, R-matrix 300 includes sixteen rows 210 and eight columns 220 for a total of 128 matrix cells 230. Like with H-matrix 200, this example of R-matrix 300 includes 64 data bits and 7 parity bits for a total of 71 bits. For R-matrix 300, the number of rows 210 is increased while keeping the number of columns 220 the same. Thus there are significantly more matrix cells 230 in R-matrix 300 as compared with H-matrix 200 for the same number of bits, namely approximately a 9-to-7 ratio of occupied cells to unoccupied cells. (The term "approximately" is used herein to indicate a variation of no more than 20 percent.) Many of the added matrix cells 230 in R-matrix 300 are unoccupied. Generally, by almost doubling a number of rows while maintaining a number of columns with respect to a block size of data and parity bits, an R-matrix format may be obtained with rearrangement of data bits while keeping parity bits in there same locations as compared with H-matrix 200 of FIG. 2.

Data bits a0[15:0], a1[15:0], b0[15:0], and b1[15:0] in R-matrix 300 are reordered as compared with those data bits in H-matrix 200. This reordering of data bits effectively means that parity bits P0 through P6 of R-matrix 300 are not the same as parity bits p0 through p6 of H-matrix 200, even though such parity bits are located in the same locations in both matrices. In other words, parity data in a Hamming Code configuration or H-matrix 200 is located in the same positions relative to one another as in R-matrix 300, even though the number of rows is doubled as between the two different types of matrices.

Some of matrix cells 230 may be thought of as unoccupied; however, data and parity bits of R-matrix 300 are written to and read from memory cells of a memory array. Each R-matrix may for example be read as a block, namely with a starting address and a block length, which in this example is 72 bits. In such an embodiment, such unoccupied matrix cells 230 are empty, namely these positions are not used. Accordingly, hard or soft logic may be used to avoid use of these positions. For example, encoding and/or decoding circuitry may be configured to ignore or effectively skip all unoccupied matrix cells 230.

FIG. 4 is a listing diagram depicting an exemplary embodiment of parity bit equations 499 for R-matrix 300 of FIG. 3. In other words, parity bit equations 499 are for generating parity bits P0 through P7 of R-matrix 300. Equations 400 through 407 respectively are for generating parity bits P0 through P7. In the notation of Equations 400 through 407, the symbol "^" denotes an exclusive-OR ("XOR") operation. The notation in Equation 407 of "(^a0[15:0])" denotes XOR operation of all bits in the parenthesis, namely for this example a0[15]^a0[14]^a0[13]^a0[12]^a0[11]^a0[10]^a0[9]^a0[8]^a0[7]^a0[6]^a0[5]^a0[4]^a0[3]^a0[2]^a0[1]^a0[0]. Equations 400 through 406 generally represent XORing subsets of input data.

An encoder may be configured to generate parity bits P0 through P7 in accordance with Equations 400 through 407 by arranging input data into such equations or format, where such arrangement may be controlled by software or hardware or a combination thereof. After generating parity bits P0 through P7, such encoder may be configured to provide such parity bits P0 through P7 with data bits a0[15:0], a1[15:0], b0[15:0], and b1[15:0] in an arrangement for subsequent decoding.

Generally, parity bits P0 through P6 are individual parity bits; however, parity bit P7 may be thought of as an overall parity bit formed by XORing all data bits and all parity bits, namely for example parity bits P0 and P6. In other words, n−1, for n a positive integer greater than zero, parity bits are generated first. An nth parity bit is generated using all data bits and all (n−1) parity bits.

FIG. 5 is a listing diagram depicting an exemplary embodiment of syndrome bit equations 599 for R-matrix 300 of FIG. 3. Syndrome bit equations 599 are for generating syndrome bits SYND[0] ("S0") through SYND[7] ("S7") of an encoded R-matrix 300. In other words, syndrome bit equations 599 are for generating syndrome bits SYND[0] through SYND[7] for decoding of an encoded or rearranged data in R-matrix 300. Equations 500 through 507 respectively are for generating syndrome bits SYND[0] through SYND[7]. Equations 500 through 506 generally represent XORing subsets of input data with an associated parity bit.

Generally, syndrome bits S0 through S6 are individual decode check or parity bits; however, syndrome bit P7 may be thought of as an overall parity bit formed of all data bits and all parity bits, namely for example parity bits P0 through P7. In other words, n−1, for n a positive integer greater than zero, syndrome bits are generated from subsets of input data bits and an associated (n−1) parity bit. An nth syndrome bit is generated using all data bits and all parity bits.

Equations 500 through 507 respectively are almost the same as Equations 400 through 407. To obtain Equations 500 through 507 from Equations 400 through 407, Equations 400 through 407 each include one additional XOR operation with a parity bit. More particularly, Equation 500 is Equation 400 with the addition of an XOR operation of parity bit P0. Likewise, Equation 501 is Equation 401 with the addition of an XOR operation of parity bit P1. Thus, by respectively XORing parity bits P0 through P7 with Equations 400 through 407, Equations 500 through 507 may be obtained.

Effectively Equations 500 through 507 are parity equations for decoding. Along those lines, a decoder may be configured in accordance with Equations 500 through 507. Furthermore, an encoder in accordance with Equations 400 through 407 may have coupled thereto respective XOR circuits for XORing P0 through P7. In such an embodiment, control circuitry may be used such that: in an encode mode, such XOR circuits for XORing P0 through P7 respectively with Equations 400 through 407 are not used; and in a decode mode, such XOR circuits for XORing P0 through P7 respectively with Equations 400 through 407 are used. However, continuing the above-example of SRAM, and in particular BRAM, where such BRAM is dual ported allowing for memory write and read operations to different memory locations in a same clock cycle, separate encode and decode logic circuits may be used.

Figure 6:
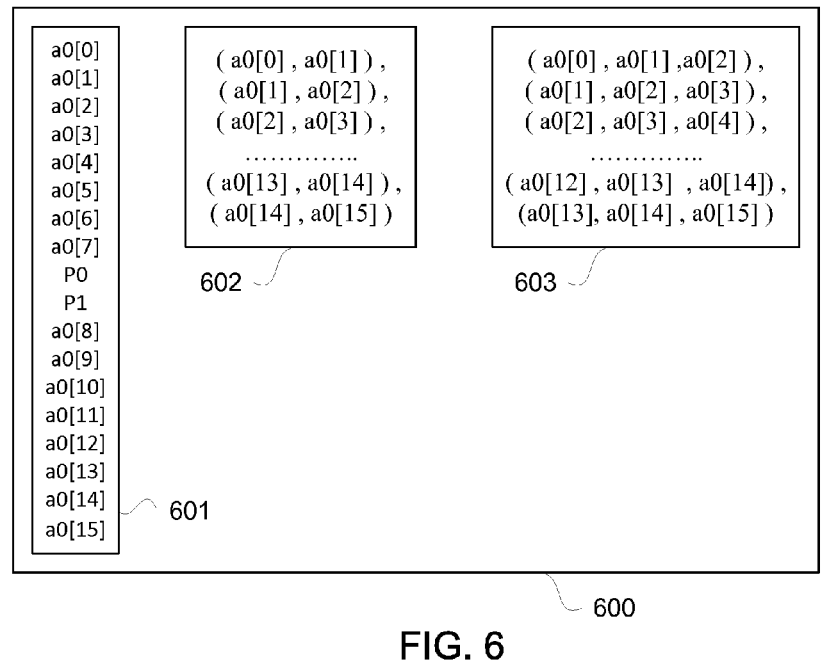
FIG. 6 is a block diagram depicting an exemplary embodiment of information arrangements for the R-matrix 300 of FIG. 3.

FIG. 6 is a block diagram depicting an exemplary embodiment of information arrangements 600 for R-matrix 300 of FIG. 3. There are three information arrangements in information arrangements 600, namely: (1) 1-tuple bits ("1-tuples") or singleton bits ("singletons") of bits 601, (2) 2-tuple bits ("2-tuples") or double bits ("pairs") of bits 602, and (3) 3-tuple bits ("3-tuples") or triple bits ("triplets") of bits 603. Even though the terms "pairs" and "triplets" are used, it does not mean that all bits with such set are identical, even though they may be. Thus, for example, a pair of bits may be any of (1,0), (0,1), (1,1), or (0,0).

Singleton bits 601 are individual data and parity bits ordered in sequences as follows: a0[0] through a0[7], P0, P1, a0[8] through a0[15]. In other words, parity bits P0 and P1 are located in sequence in the middle of the sequence of data bits a0[0] through a0[15]. After singleton bits 601, two adjacent bits from singleton bits 601 are used to form pairs of adjacent bits 602, as follows: (a0[0], a0[1]), (a0[1], a0[2]), . . . , (a0[7], P0), (P0, P1), (P1, a0[8]), . . . , (a0[13], a0[14]), (a0[14], a0[15]). As there are 18 singleton bits 601 in this exemplary embodiment, there are 17 double adjacencies of bits, namely there are 17 combinations of pairs of bits 602. In each sequence of an input data subset, at least one parity bit is located in the middle of such sequence.

Three adjacent bits are associated or concatenated from singleton bits 601 to form triplets of adjacent bits 603, as follows: (a0[0], a0[1], a0[2]), (a0[1], a0[2], a0[3]), . . . , (a0[7], P0, P1), (P0, P1, a0[8]), (P1, a0[8], a0[9]), . . . , (a0[12], a0[13], a0[14]), (a0[13], a0[14], a0[15]). Once a last singleton bit 601 is used in forming a pair or a triplet, as described herein, then formation of bit pairs 602 or bit triplets 603, as applicable, is completed. Along those lines, for this exemplary embodiment, there are 16 triple adjacencies of bits, namely there are 16 combinations of triplets of bits 603. Thus, pairs of bits 602 and triplets of bits 603 may each be formed from singleton bits 601 to provide a first information arrangement 600 in a sequence of information arrangements 600 through 900, as described below with respective reference to FIGS. 7 through 9.

Figures 7, 8, 9:
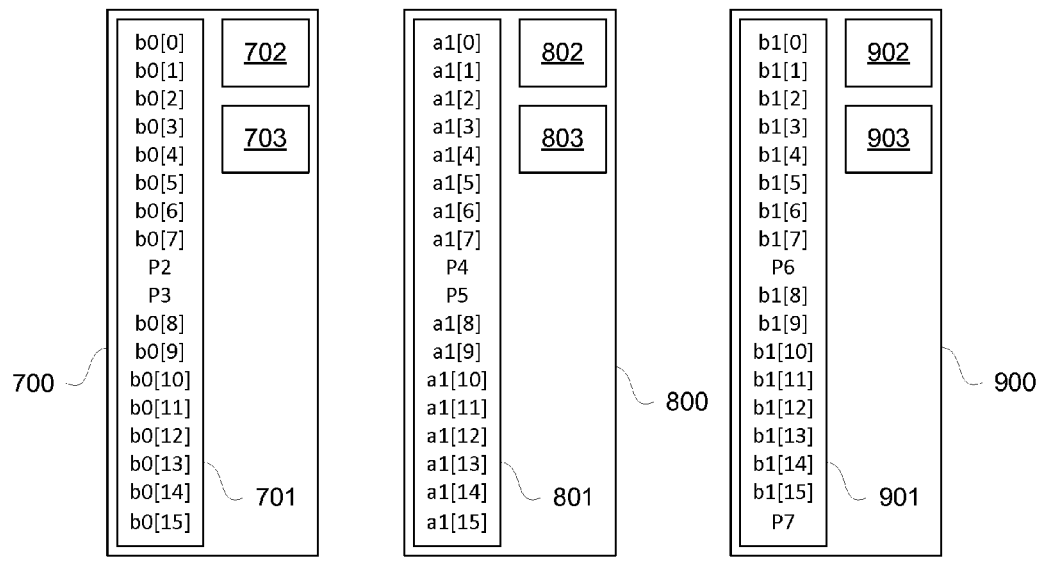
FIGS. 7 through 9 are block diagrams depicting respective exemplary embodiments of information arrangements, respectively, for the R-matrix of FIG. 3.

FIGS. 7 through 9 are block diagrams depicting respective exemplary embodiments of information arrangements 700, 800, and 900, respectively, for R-matrix 300 of FIG. 3. In each of information arrangements 700, 800, and 900, there are: (1) 1-tuples or singletons of bits, (2) 2-tuples or pairs of bits, and (3) 3-tuples or triplets of bits. However, only 1-tuples or singletons of bits 701, 801, and 901 for data sets b0[15:0], a1[15:0], and b1[15:0], respectively, for R-matrix 300 of FIG. 3 are illustratively depicted in detail for purposes of clarity and not limitation, as pairs 702, 802 and 902, and triplets 703, 803 and 903 may be formed as previously described with reference to pairs 602 and triplets 603, respectively, but by using singletons 701, 801, and 901, respectively. Along those lines, each of 1-tuples or singletons of bits 701, 801, and 901 has two different parity bits, as described below in additional detail.

With reference to FIG. 7, singleton bits 701 are individual data and parity bits ordered as follows: data bits b0[0] through b0[7], P2, P3, b0[8] through b0[15]. In other words, parity bits P2 and P3 are located in sequence in the middle of the sequence of data bits b0[0] through b0[15]. After singleton bits 701, two adjacent bits from singleton bits 701 are used to form pairs of adjacent bits 702, as follows: (b0[0], b0[1]), (b0[1], b0[2]), . . . , (b0[7], P2), (P2, P3), (P3, b0[8]), . . . , (b0[13], b0[14]), (b0[14], b0[15]). As there are 18 singleton bits 701 in this exemplary embodiment, there are 17 double adjacencies of bits, namely there are 17 combinations of pairs of bits. After pairs of bits, three adjacent bits from singleton bits 701 are used to form triplets of adjacent bits 703, as follows: (b0[0], b0[1], b0[2]), (b0[1], b0[2], b0[3]), . . . , (b0[7], P2, P3), (P2, P3, b0[8]), (P3, b0[8], b0[9]), . . . , (b0[12], b0[13], b0[14]), (b0[13], b0[14], b0[15]). Once a last singleton bit 701 is used in forming a pair or a triplet, as described herein, then formation of bit pairs or bit triplets, as applicable, is completed. Along those lines, for this exemplary embodiment, there are 16 triple adjacencies of bits, namely there are 16 combinations of triplets of bits. Thus, pairs of bits 702 and triplets of bits 703 may each be formed from singleton bits 701 to provide a second information arrangement 700 in a sequence of information arrangements 600 through 900.

With reference to FIG. 8, singleton bits 801 are individual data and parity bits ordered as follows: data bits a1[0] through a1[7], P4, P5, a1[8] through a1[15]. In other words, parity bits P4 and P5 are located in sequence in the middle of the sequence of data bits a1[0] through a1[15]. After singleton bits 801, two adjacent bits from singleton bits 801 are used to form pairs of adjacent bits 802, as follows: (a1[0], a1[1]), (a1[1], a1[2]), . . . , (a1[7], P4), (P4, P5), (P5, a1[8]), . . . , (a1[13], a1[14]), (a1[14], a1[15]). As there are 18 singleton bits 801 in this exemplary embodiment, there are 17 double adjacencies of bits, namely there are 17 combinations of pairs of bits. After pairs of bits, three adjacent bits from singleton bits 801 are used to form triplets of adjacent bits 803, as follows: (a1[0], a1[1], a1[2]), (a1[1], a1[2], a1[3]), . . . , (a1[7], P4, P5), (P4, P5, a1[8]), (P5, a1[8], a1[9]), . . . , (a1[12], a1[13], a1[14]), (a1[13], a1[14], a1[15]). Once a last singleton bit 801 is used in forming a pair or a triplet, as described herein, then formation of bit pairs or bit triplets, as applicable, is completed. Along those lines, for this exemplary embodiment, there are 16 triple adjacencies of bits, namely there are 16 combinations of triplets of bits. Thus, pairs of bits 802 and triplets of bits 803 may each be formed from singleton bits 801 to provide a third information arrangement 800 in a sequence of information arrangements 600 through 900.

With reference to FIG. 9, singleton bits 901 are individual data and parity bits ordered as follows: data bits b1[0] through b1[7], P6, b1[8] through b1[15], P7. In other words, parity bit P6 is located in the middle of the sequence of data bits b1[0] through b1[15], and parity bit P7 is located at the end of the sequence of data bits b1[0] through b1[15]. After singleton bits 901, two adjacent bits from singleton bits 901 are used to form pairs of adjacent bits 902, as follows: (b1[0], b1[1]), (b1[1], b1[2]), . . . , (b1[7], P6), (P6, b1[8]), . . . , (b1[14], b1[15]), (b1[15], P7). As there are 18 singleton bits 901 in this exemplary embodiment, there are 17 double adjacencies of bits, namely there are 17 combinations of pairs of bits. After pairs of bits, three adjacent bits from singleton bits 901 are used to form triplets of adjacent bits 903, as follows: (b1[0], b1[1], b1[2]), (b1[1], b1[2], b1[3]), . . . , (b1[7], P6, b1[8]), (P6, b1[8], b1[9]), . . . , (b1[13], b1[14], b1[15]), (b1[14], b1[15], P7). Once a last singleton bit 901 is used in forming a pair or a triplet, as described herein, then formation of bit pairs or bit triplets, as applicable, is completed. Along those lines, for this exemplary embodiment, there are 16 triple adjacencies of bits, namely there are 16 combinations of triplets of bits. Thus, pairs of bits 902 and triplets of bits 903 may each be formed from singleton bits 901 to provide a fourth information arrangement 900 in a sequence of information arrangements 600 through 900.

Figure 10:
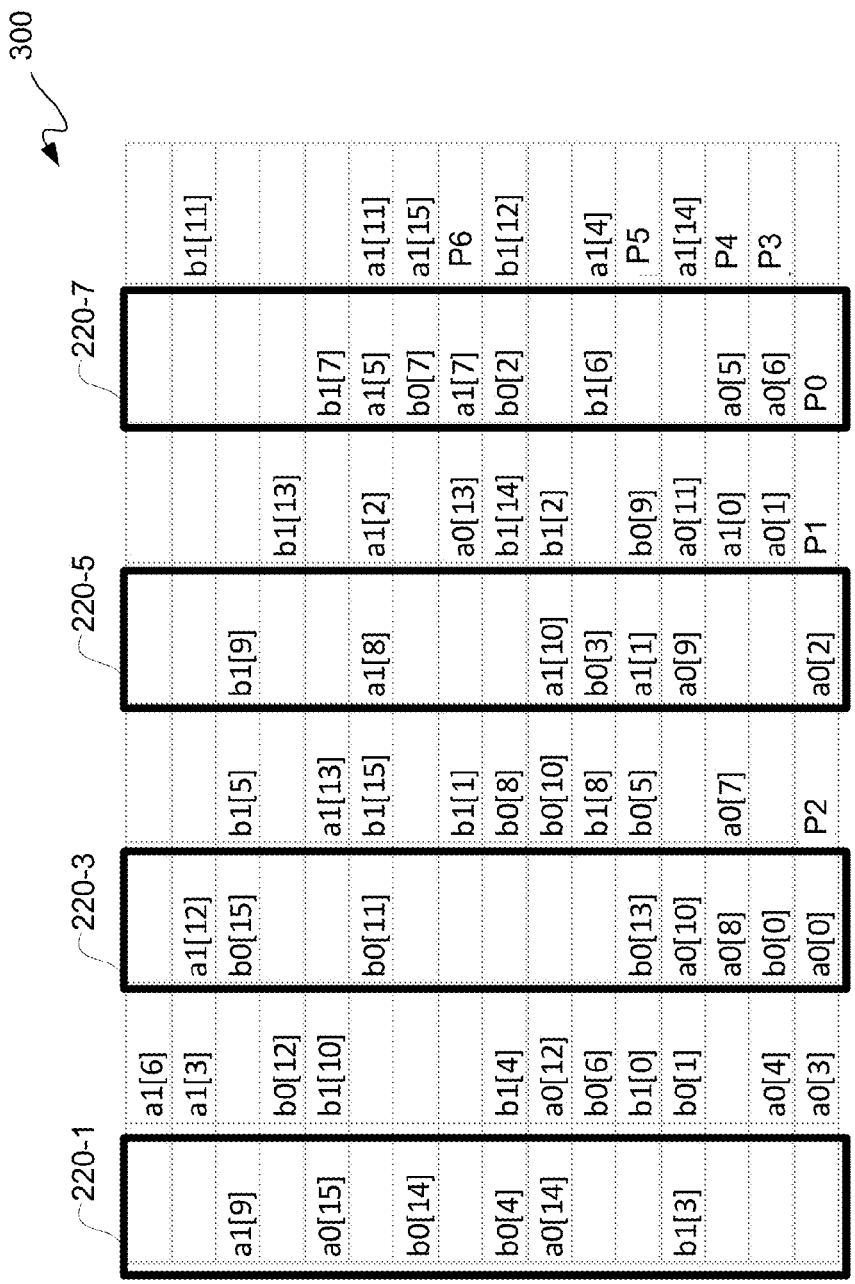
FIG. 10 is the table diagram of FIG. 3 depicting an exemplary embodiment of R-matrix 300 for determining a P0 parity bit or a SYND[0] ("S0") syndrome bit.

FIG. 10 is the table diagram of FIG. 3 depicting an exemplary embodiment of R-matrix 300 for determining a P0 parity bit or a SYND[0] ("S0") syndrome bit. Bits in columns 220-1, 220-3, 220-5, and 220-7 without parity bit P0 are XOR processed as previously described to generate a P0 parity bit, which is then added to the bottom row of column 220-7. In other words, every other column 220, starting from an initial column 220-1, is used. For generation of an S0 syndrome bit, bits in columns 220-1, 220-3, 220-5, and 220-7 with parity bit P0 are XOR processed as previously described to generate an S0 syndrome bit. Again, in other words, every other column 220, starting from an initial column 220-1, is used.

Figure 11:
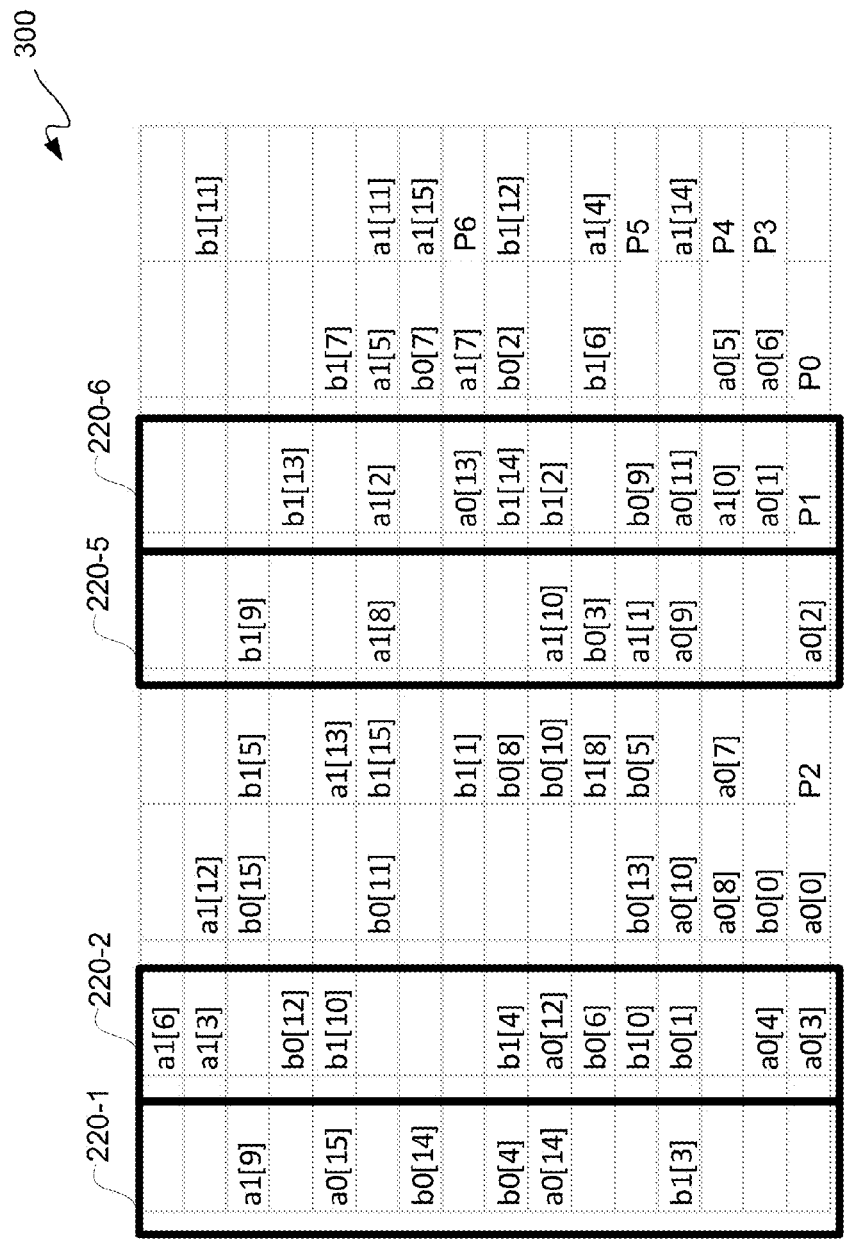
FIG. 11 is the table diagram of FIG. 3 depicting an exemplary embodiment of the R-matrix for determining a P1 parity bit or a SYND[1] ("S1") syndrome bit.

FIG. 11 is the table diagram of FIG. 3 depicting an exemplary embodiment of R-matrix 300 for determining a P1 parity bit or a SYND[1] ("51") syndrome bit. Bits in columns 220-1, 220-2, 220-5, and 220-6 without parity bit P1 are XOR processed as previously described to generate a P1 parity bit, which is then added to the bottom row of column 220-6. In other words, every other two columns 220, starting from an initial column 220-1, are used. For generation of an 51 syndrome bit, bits in columns 220-1, 220-2, 220-5, and 220-6 with parity bit P1 are XOR processed as previously described to generate an 51 syndrome bit. Again, in other words, every other two columns 220, starting from an initial column 220-1, are used.

Figure 12:
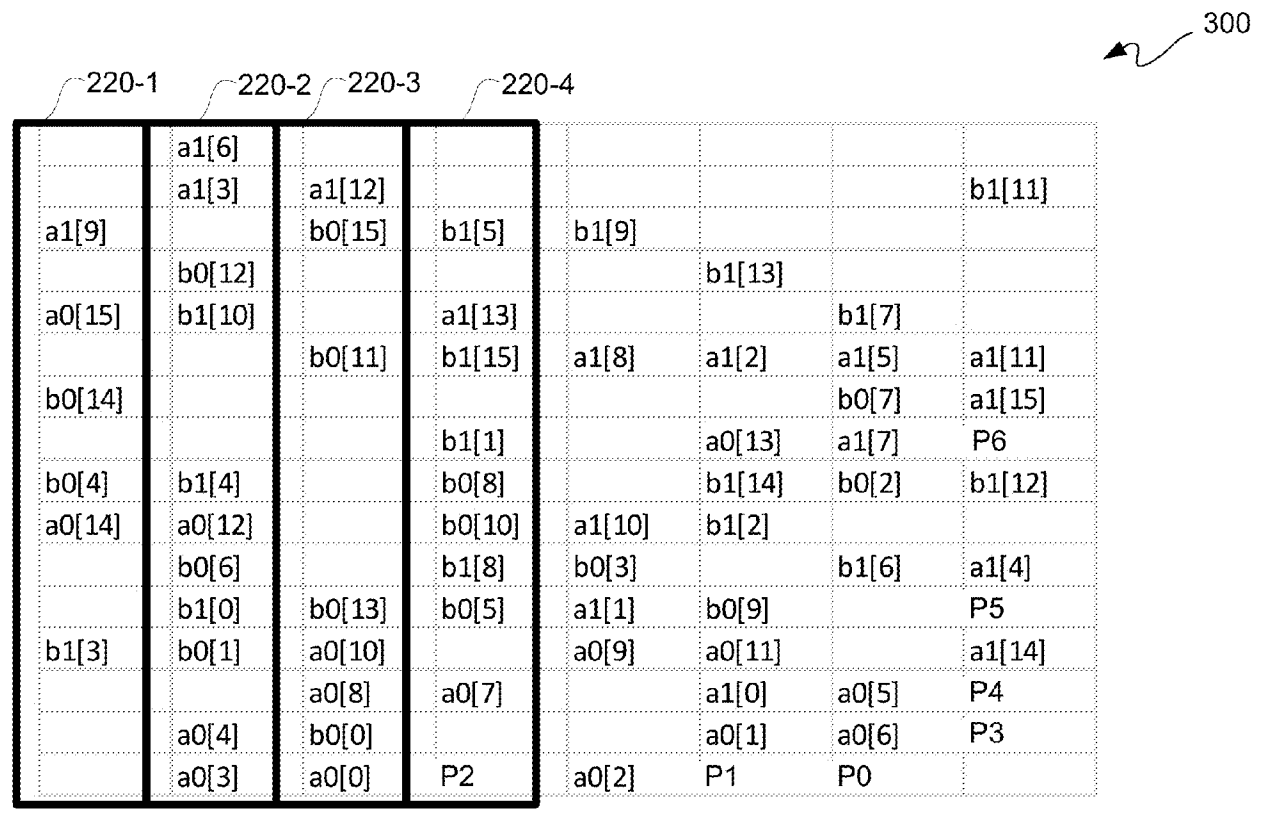

FIG. 12 is the table diagram of FIG. 3 depicting an exemplary embodiment of R-matrix 300 for determining a P2 parity bit or a SYND[2] ("S2") syndrome bit. Bits in columns 220-1, 220-2, 220-3, and 220-4 without parity bit P2 are XOR processed as previously described to generate a P2 parity bit, which is then added to the bottom row of column 220-4. In other words, every other four columns 220, starting from an initial column 220-1, are used. For generation of an S2 syndrome bit, bits in columns 220-1, 220-2, 220-3, and 220-4 with parity bit P2 are XOR processed as previously described to generate an S2 syndrome bit. Again, in other words, every other four columns 220, starting from an initial column 220-1, are used.

To this point, with reference to FIGS. 10 through 12, a binary progression for selection of columns is used. In other words, $2^0, 2^1, 2^2, \ldots$, column(s) are selected at a time before skipping $2^0, 2^1, 2^2, \ldots$, column(s) at a time, as respectively applicable. Once the binary progression is completed for all column isolatable parity bits for an R-matrix 300, then another binary progression may be used for all row isolatable parity bits for an R-matrix 300. Of course, the actual order of determining parity bits P0 through P6 and/or syndrome bits S0 through S7 is irrelevant, as any order may be used. However, parity bit P7 may be determined after determination of parity bits P0 through P6.

Figure 13:
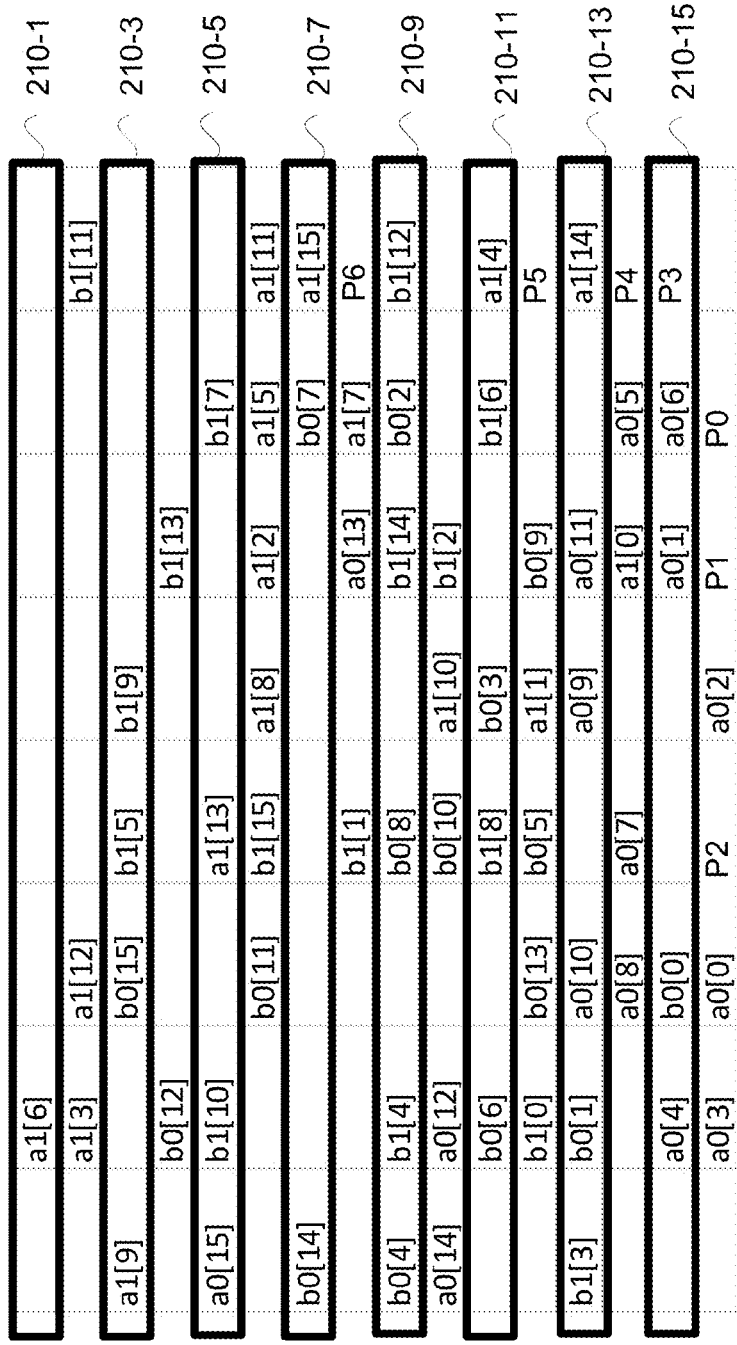
FIG. 13 is the table diagram of FIG. 3 depicting an exemplary embodiment of R-matrix for determining a P3 parity bit or a SYND[3] ("S3") syndrome bit.

FIG. 13 is the table diagram of FIG. 3 depicting an exemplary embodiment of R-matrix 300 for determining a P3 parity bit or a SYND[3] ("S3") syndrome bit. Bits in rows 210-1, 210-3, 210-5, 210-7, 210-9, 210-11, 210-13, and 210-15 without parity bit P3 are XOR processed as previously described to generate a P3 parity bit, which is then added to the end of row 210-15. In other words, every other row 210, starting from an initial row 210-1, is used. For generation of an S3 syndrome bit, bits in rows 210-1, 210-3, 210-5, 210-7, 210-9, 210-11, 210-13, and 210-15 with parity bit P3 are XOR processed as previously described to generate an S3 syndrome bit. Again, in other words, every other row 210, starting from an initial row 210-1, is used.

Figure 14:
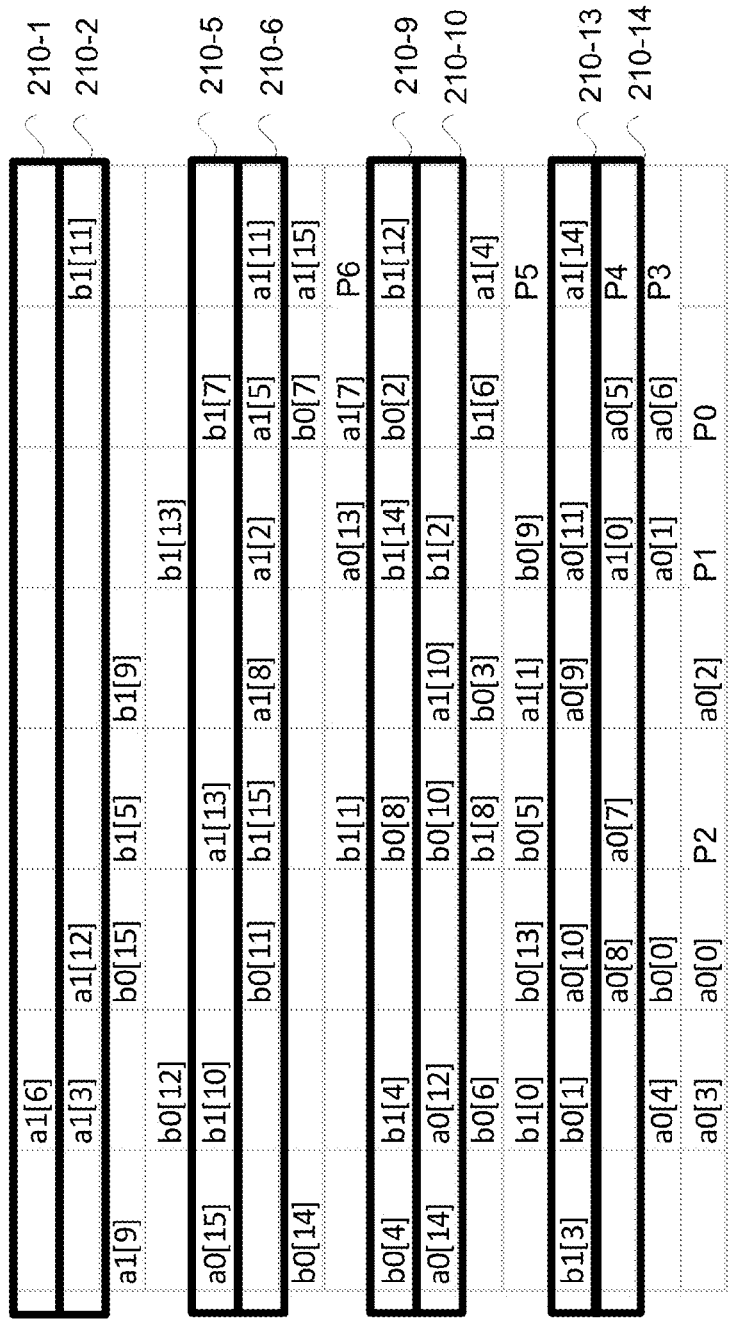
FIG. 14 is the table diagram of FIG. 3 depicting an exemplary embodiment of R-matrix for determining a P4 parity bit or a SYND[4] ("S4") syndrome bit.

FIG. 14 is the table diagram of FIG. 3 depicting an exemplary embodiment of R-matrix 300 for determining a P4 parity bit or a SYND[4] ("S4") syndrome bit. Bits in rows 210-1, 210-2, 210-5, 210-6, 210-9, 210-10, 210-13, and 210-14 without parity bit P4 are XOR processed as previously described to generate a P4 parity bit, which is then added to the end of row 210-14. In other words, every other two rows 210, starting from an initial row 210-1, are used. For generation of an S4 syndrome bit, bits in rows 210-1, 210-2, 210-5, 210-6, 210-9, 210-10, 210-13, and 210-14 with parity bit P4 are XOR processed as previously described to generate an S4 syndrome bit. Again, in other words, every other two rows 210, starting from an initial row 210-1, are used.

Figure 15:
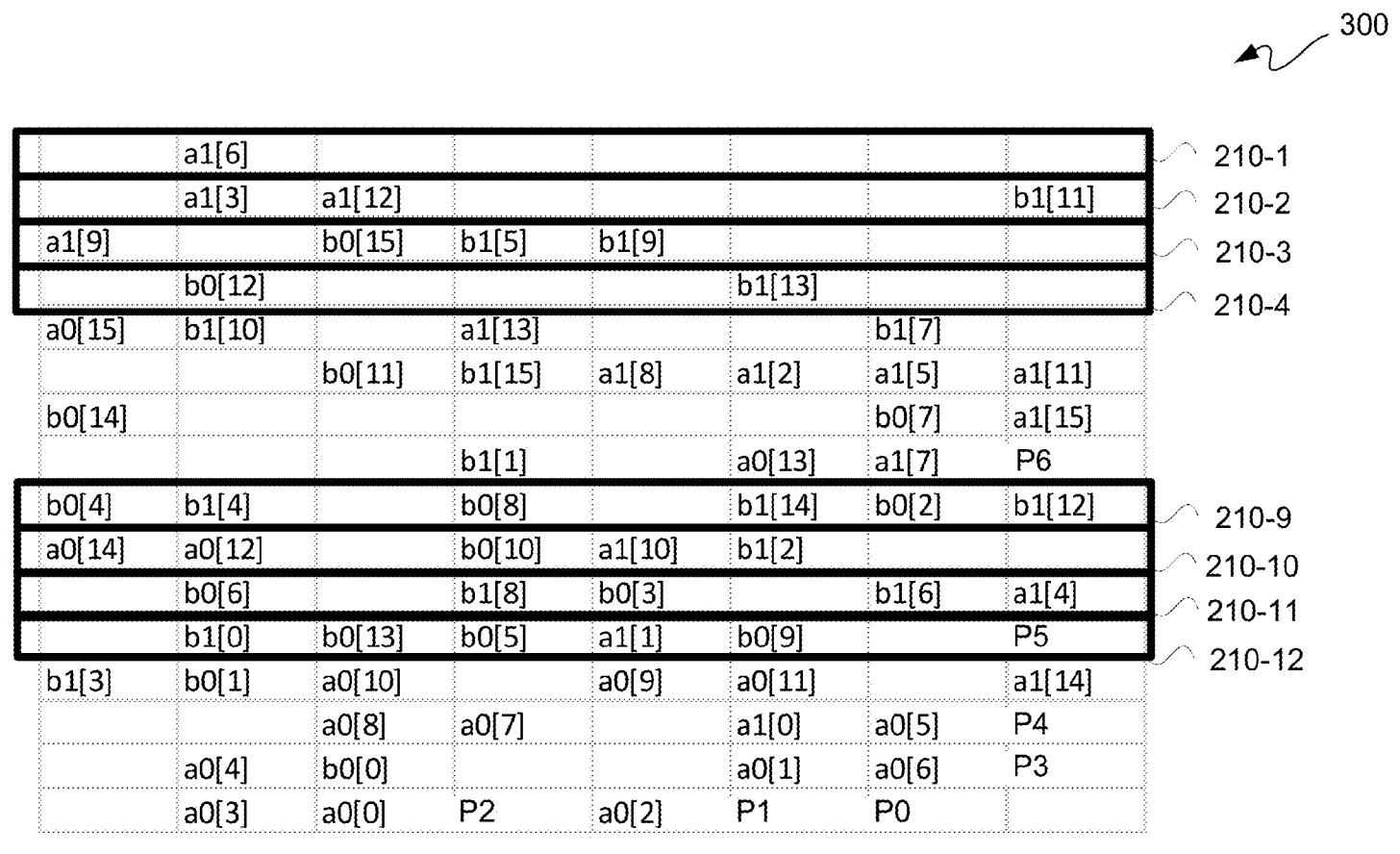

FIG. 15 is the table diagram of FIG. 3 depicting an exemplary embodiment of R-matrix 300 for determining a P5 parity bit or a SYND[5] ("S5") syndrome bit. Bits in rows 210-1, 210-2, 210-3, 210-4, 210-9, 210-10, 210-11, and 210-12 without parity bit P5 are XOR processed as previously described to generate a P5 parity bit, which is then added to the end of row 210-12. In other words, every other four rows 210, starting from an initial row 210-1, are used. For generation of an S5 syndrome bit, bits in rows 210-1, 210-2, 210-3, 210-4, 210-9, 210-10, 210-11, and 210-12 with parity bit P5 are XOR processed as previously described to generate an S5 syndrome bit. Again, in other words, every other four rows 210, starting from an initial row 210-1, are used.

Figure 16:
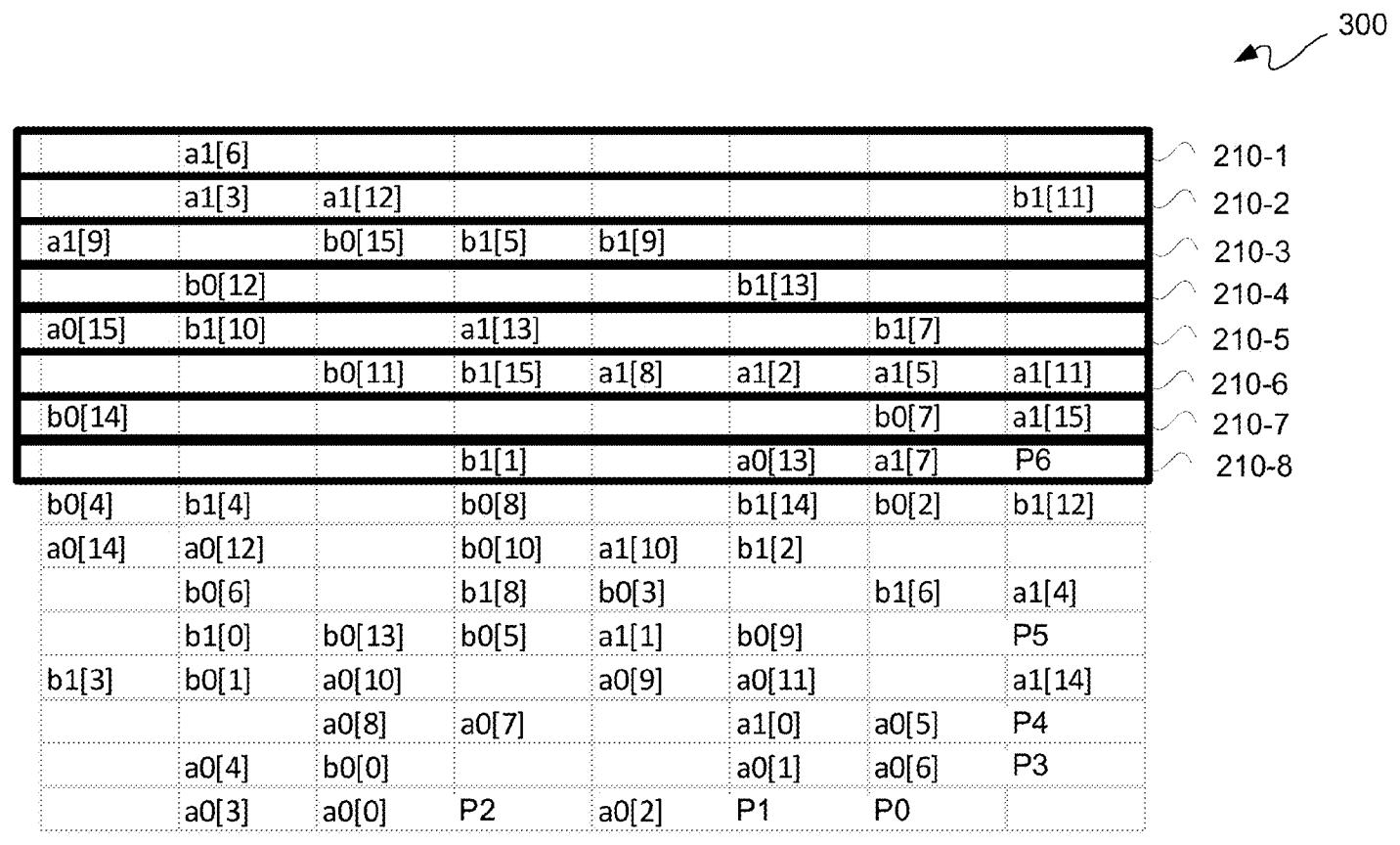

FIG. 16 is the table diagram of FIG. 3 depicting an exemplary embodiment of R-matrix 300 for determining a P6 parity bit or a SYND[6] ("S6") syndrome bit. Bits in rows 210-1, 210-2, 210-3, 210-4, 210-5, 210-6, 210-7, and 210-8 without parity bit P6 are XOR processed as previously described to generate a P6 parity bit, which is then added to the end of row 210-8. In other words, every other eight rows 210, starting from an initial row 210-1, are used. For generation of an S6 syndrome bit, bits in rows 210-1, 210-2, 210-3, 210-4, 210-5, 210-6, 210-7, and 210-8 with parity bit P6 are XOR processed as previously described to generate an S6 syndrome bit. Again, in other words, every other eight rows 210, starting from an initial row 210-1, are used.

Figure 17:
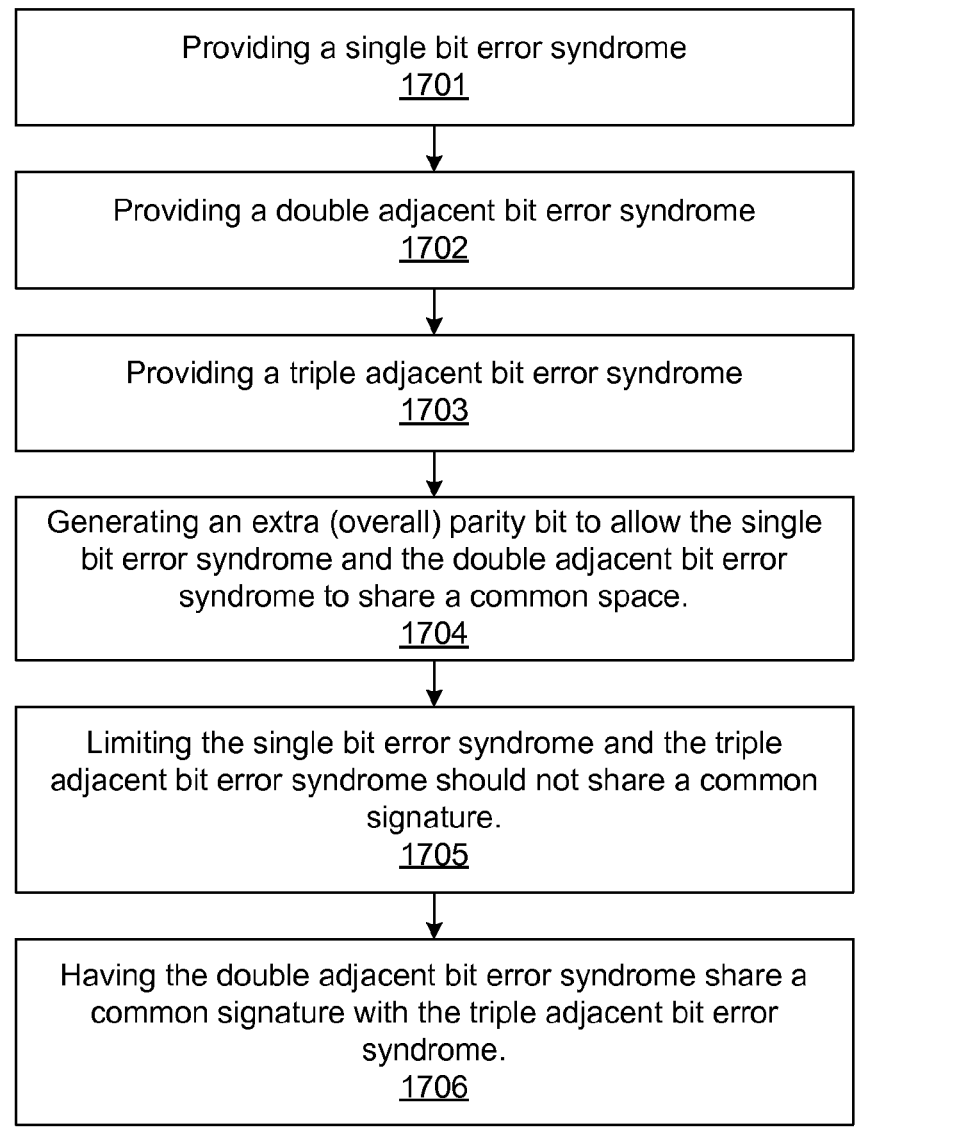
FIG. 17 is a flow diagram depicting an exemplary embodiment of an R-matrix generation flow.

FIG. 17 is a flow diagram depicting an exemplary embodiment of an R-matrix generation flow 1700. Continuing the above description, R-matrix 300 has multiple conditions to be satisfied in order to operate in any of the following modes or have the following capabilities: (0) detect no bit in error, (1) detect and correct a 1-bit error, (2) detect a 2-nonadjacent bit error, (3) detect and correct a 2-adjacent bit error, and/or (4) detect a 3-adjacent bit error. By 2-adjacent bit error and 3-adjacent bit error, it is generally meant that both or all three, as applicable, adjacent bits are in error.

At 1701, a single bit error syndrome is provided. By single bit error syndrome, it is generally meant a syndrome corresponding to each possible single bit error. Such a single bit error syndrome should be unique with respect to detection of single bit errors, such as previously described.

At 1702, a double adjacent bit error syndrome is provided. By double adjacent bit error syndrome, it is generally meant a syndrome corresponding to each possible double adjacent bits error, namely where two adjacent bits are both in error. Such a double adjacent bit error syndrome should be unique with respect to detection of double adjacent bit errors, such as previously described.

At 1703, a triple adjacent bit error syndrome is provided. By triple adjacent bit error syndrome, it is generally meant a syndrome corresponding to each possible triple adjacent bits error, namely where three adjacent bits are all in error. Such a triple adjacent bit error syndrome does not have to be unique with respect to detection of triple adjacent bit errors, such as previously described. In other words, such a triple adjacent bit error syndrome can share some common error space with the double adjacent bit error syndrome of 1702.

At 1704, an extra parity bit, such as an "overall" parity bit, such as for example parity bit P7 as previously described, is generated. Such extra parity bit is to allow the single bit error syndrome of 1701 and the double adjacent bit error syndrome of 1702 to share some common error space. For example, P7 equals 1 for a single bit error; and P7 equals 0 for a double bit error. It should be borne in mind that P7 equals 1 for an adjacent 3 bits in error, and so 1 bit error space and 3 adjacent bits in error space cannot share the same syndrome space. In other words, even if an error syndrome is the same for both the single bit error syndrome of 1701 and the double adjacent bit error syndrome of 1702, such extra parity bit may be used to distinguish a double adjacent bit error from a single bit error.

At 1705, the single bit error syndrome and/or the triple adjacent bit error syndrome are limited such that they do not share a common signature, namely they have mutually exclusive signatures. In other words, no 1 bit error syndrome should match any triple adjacent bit error syndrome, namely the single bit error syndrome and the triple adjacent bit error syndrome have mutually exclusive error spaces.

At 1706, the double adjacent bit error syndrome and the triple adjacent bit error syndrome share a common signature. The triple adjacent bit error syndrome may be provided such that a 3-bit error detect decode can be used to distinguish between a double adjacent bit error and a triple adjacent bit error. Accordingly, by having the double adjacent bit error syndrome and the triple adjacent bit error syndrome share some common error space, these two different types of errors may be distinguished from one another.

For purposes of clarity and not limitation, continuing an example of an FPGA implementation using BRAM, a 4-to-1 column multiplexing may be used in such BRAM, which may be used in correcting four consecutive bits in error in four different words in four clock cycles. In this example, a word is 16 bits long. However, in other embodiments, other configurations of column multiplexing and/or word length may be used.

With the above exemplary embodiment in mind, suppose for example, an SEU event upsets more than 4 consecutive memory bit cells and less than 9 consecutive memory bit cells. A single SEU causing damages to 5 consecutive memory bit cells and less than 9 consecutive memory bit cells creates a scenario where there could be minimum of 1 set of 2 adjacent bits in error and maximum of 4 sets of 2 adjacent bits in error. The exemplary embodiment of R-matrix 300 of FIG. 3 can correct a maximum of 4 sets of 2 adjacent bits in error in 4 clock cycles.

Now, suppose an SEU upsets more than 8 consecutive memory bit cells and less than 13 consecutive memory bit cells. A single SEU causing damages to 9 consecutive memory bit cells and less than 13 consecutive memory bit cells creates a scenario where there could be minimum of 1 set of 3 adjacent bits in error or 4 sets of 3 adjacent bits in error. The exemplary embodiment of R-matrix 300 of FIG. 3 can detect a maximum of 4 sets of 3 adjacent bits in error in 4 clock cycles.

Figure 18:
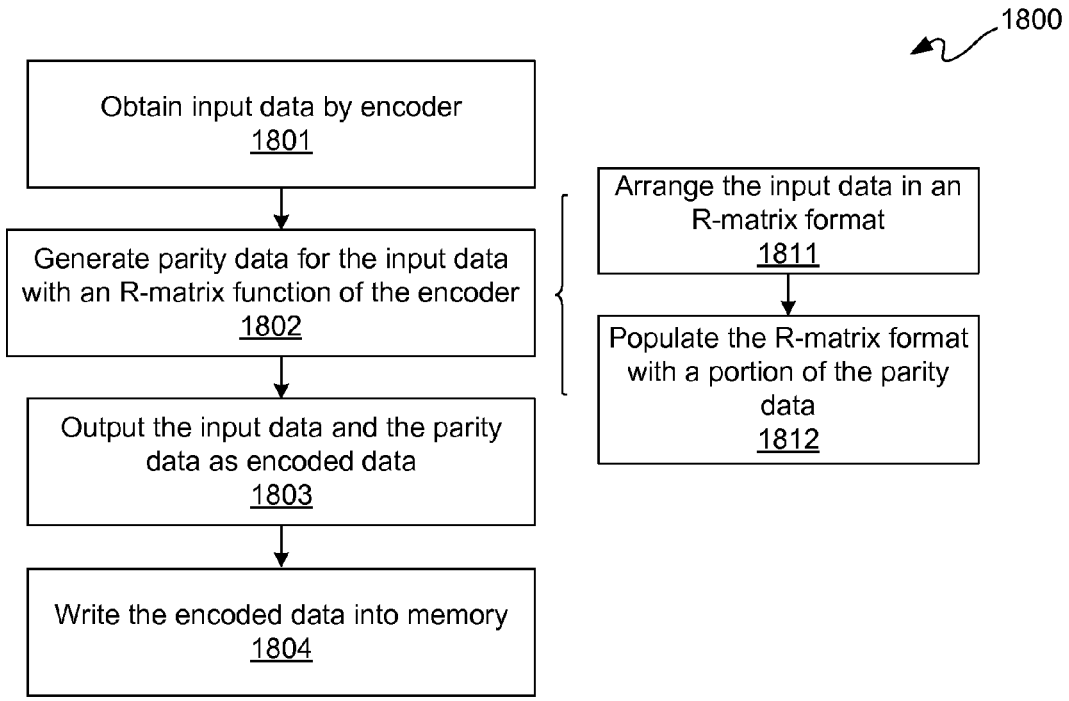
FIG. 18 is a flow diagram depicting an exemplary embodiment of an encoding flow.
Figure 20:
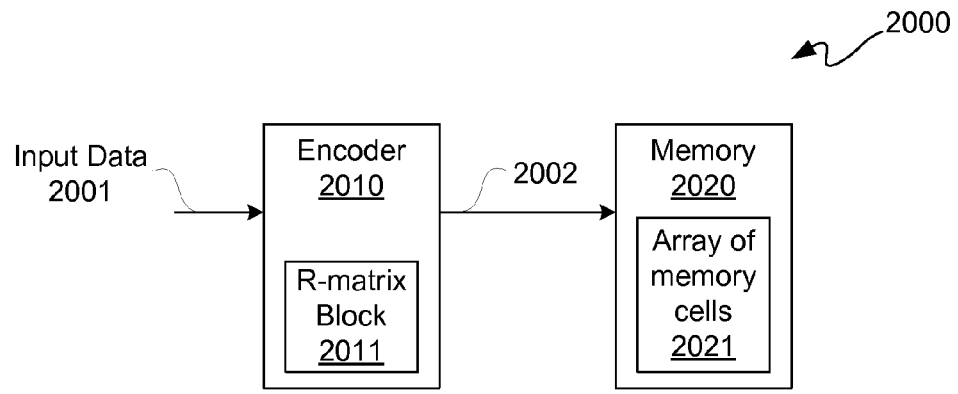
FIG. 20 is a block diagram depicting an exemplary embodiment of an encoding system.

FIG. 18 is a flow diagram depicting an exemplary embodiment of an encoding flow 1800. FIG. 20 is a block diagram depicting an exemplary embodiment of an encoding system 2000. With simultaneous reference to FIGS. 18 and 20, encoding flow 1800 and encoding system 2000 are further described.

At 1801, an encoder 2010 obtains input data 2001. Continuing the above example for purposes of clarity by way of example and not limitation, input data may be the above example of 64-bit input data, namely data bits a0[15:0], a1[15:0], b0[15:0], and b1[15:0].

At 1802, an R-matrix function or block 2011 of encoder 2010 takes such data input obtained at 1801 and generates parity bits, such as parity bits P0 through P7. At 1803, such input data and parity data is output as encoded data 2002. Encoded data 2002 may be written to memory 2020 at 1804. Memory 2020 may have an array of memory cells 2021, such as an array of bit cells for example, for storing data and parity bits.

With respect to 1802, input data 2001 is arranged in an R-matrix format, as previously described herein, at 1811. At 1812, such R-matrix format may be populated with the parity data generated at 1802, such as parity bits P0 through P6 for example. An "overall" parity bit, such as parity bit P7 for example, may be stored in association with other parity bits, such as parity bits P0 through P6 for example, and associated input data 2001. Thus, continuing the above example, input in parity data may be stored in 72 bit blocks.

Figure 19:
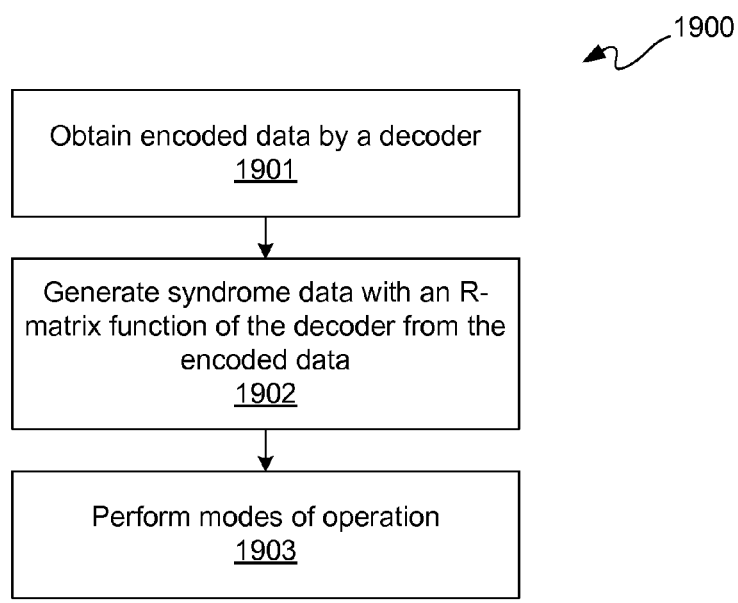
FIG. 19 is a flow diagram depicting an exemplary embodiment of a decoding flow.
Figure 21:
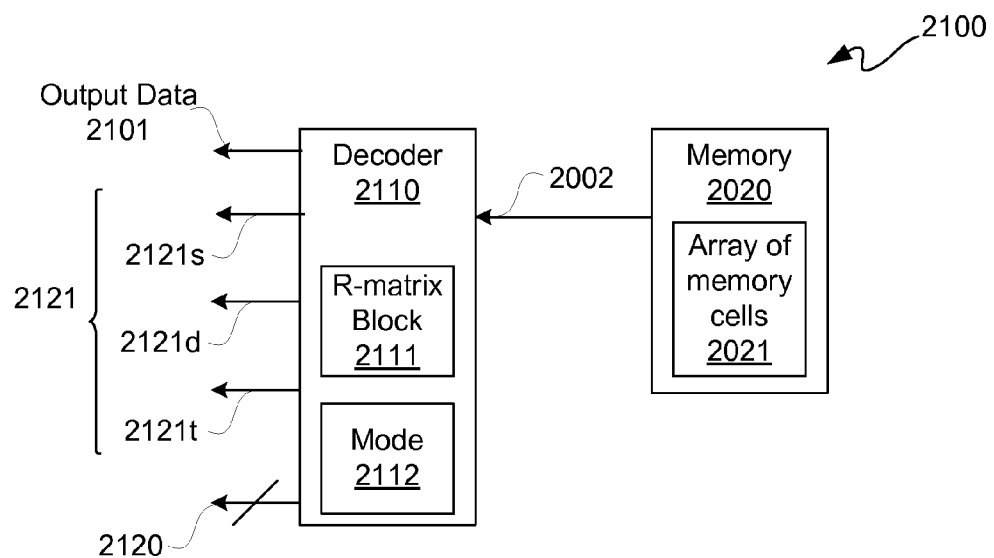
FIG. 21 is a block diagram depicting an exemplary embodiment of a decoding system.

FIG. 19 is a flow diagram depicting an exemplary embodiment of a decoding flow 1900. FIG. 21 is a block diagram depicting an exemplary embodiment of a decoding system 2100. With simultaneous reference to FIGS. 19 and 21, decoding flow 1900 and decoding system 2100 are further described.

At 1901, encoded data 2002 is obtained by a decoder 2110. Encoded data 2002 may be obtained from array of memory cells 2021 of memory 2020. Decoder 2110 may include an R-matrix function or block 2111 and a mode block 2112. Continuing the above example for purposes of clarity by way of example and not limitation, encoded data 2002 may be the above example of 64-bit input data, namely data bits a0[15:0], a1[15:0], b0[15:0], and b1[15:0], combined with parity bits P0 through P7. Along those lines, 72 bits of input and parity data may be read from memory 2020.

At 1902, an R-matrix block 2011 of decoder 2110 takes such encoded data 2002 input obtained at 1901 and generates syndrome bits 2120, such as syndrome bits S0 through S7. Optionally, syndrome bits 2120 may be output from decoder 2110.

At 1903, modes of operation of mode block 2112 may be performed using status of syndrome bits 2120. Along those lines, modes of operation of mode block 2112 may include: no error detection, detection and correction of single bit errors, detection of double bit errors, detection and correction of double adjacent bit errors, and/or detection of triple adjacent bit errors. In order to cover all the above modes, at least 8-bit parity is used. Error status signals 2121 along with decoded output data 2101 may be output from decoder 2110. Decoded output data 2101 may include both input and parity data.

For a no error detection mode, status of all generated syndrome bits 2120, such as syndrome bits S0 through S7 for example, output from decoder 2110 may be zero. For a single bit error detection and correction mode, any one of the data or parity bits may have been flipped. For this example, such 72 bits are ordered accordance with an R-matrix 300 format. For the above example, this means that anyone of 72 bits may be flipped. Status of single bit error signal 2121$s$ may be logic high, and status of double bit error signal 2121$d$ and status of triple adjacent bit error signal 2121$t$ may both be logic low. Syndrome bits S0 through S6 may be used to determine position of a bit in error, and such identified bit in error may be flipped to correct output data 2101.

For a double adjacent bit error detection and correction mode, any two adjacent data and/or parity bits may have been flipped. For the above example, this means that two adjacent bits of 72 bits may be flipped. Again, for this example, such 72 bits are ordered in accordance with an R-matrix 300 format. Status of single bit error signal 2121$s$ may be logic low. Status of double bit error signal 2121$d$ may be logic high. Status of triple adjacent bit error signal 2121$t$ may be logic low. Syndrome bits S0 through S6 may be used to determine position of double adjacent bits in error, and such identified bits in error may be flipped to correct output data 2101.

For a double bit error detection mode, any two nonadjacent data and/or parity bits may have been flipped. For the above example, this means that two nonadjacent bits of 72 bits may be flipped. Again, for this example, such 72 bits are ordered in accordance with an R-matrix 300 format. Status of single bit error signal 2121$s$ may be logic low. Status of double bit error signal 2121$d$ may be logic high. Status of triple adjacent bit error signal 2121$t$ may be logic low. Syndrome bits S0 through S6 may not be used to determine position of double bits in error.

For a triple adjacent bit error detection mode, any three adjacent data and/or parity bits may have been flipped. For the above example, this means that three adjacent bits of 72 bits may be flipped. Again, for this example, such 72 bits are ordered in accordance with an R-matrix 300 format. For an embodiment, status of single bit error signal 2121$s$ is logic low; status of double bit error signal 2121$d$ is logic low; and status of triple adjacent bit error signal 2121$t$ is logic high. Syndrome bits S0 through S6 may be used to determine position of triple adjacent bits in error; however, it may not be possible to verify that no other three adjacent bits are in error, and as such identification of an error may be provided along with output of corrupted data 2101. Thus, status signals 2121 may be used to provide single bit error status associated with a single bit error space, double adjacent bit error status associated with a double adjacent bit error space, and triple adjacent bit error status associated with a triple adjacent bit error space.

In order to more fully appreciate, some examples using actual data are provided. FIGS. 22 and 24 are respective flow diagrams depicting examples of encoding using R-matrix 300 of FIG. 3. FIGS. 23-1 through 23-3 and 25-1 through 25-3 are respective flow diagrams depicting examples of decoding using R-matrix 300 of FIG. 3 for the encoding examples of FIGS. 22 and 24, respectively. Of course, these examples of bits or other bits may be used, and these or other errors may occur.

With reference to FIG. 22, an encoding flow 2200 is described. At 2201, 64-bit hex data is input. At 2202, the hex data at 2201 is converted to binary data 2202. At 2203, 8-bit parity data is generated for the binary data of 2202. The 8-bit parity data and the 64-bit binary data of 2202 is combined in an R-matrix format as previously described herein to provide 72-bit data. Such 72-bit data may be encoded in hex, as indicated at 2204, or may be encoded in binary, as indicated at 2204.

With reference to FIG. 23-1, a decoding flow 2300 for the encoding example of FIG. 22 is described for an error injected into a first bit position a0[0] of the encoded hex data at 2204. This error is injected by an XOR operation at 2301. This error may occur at any bit location due for example to an SEU or other bit upset event. The injection of this error is to illustrate how an error in data may be detected and corrected for a single bit error.

Encoded hex data with an error in a first bit position is indicated at 2302. At 2303, syndrome error data is generated for syndrome bits S[7:0]. This is a syndrome of encoded hex data of 2302, namely hex data 2204 with an error in the first bit position. In this example, the syndrome space is 5, and the S7 bit is equal to 1. This syndrome is unique for bit a0[0] being in error, where the syndrome space for a0[0] is 5. As syndrome bit S7 equals 1, this means a single bit error has occurred.

At 2304, the bit at position a0[0] is flipped. At 2305, corrected decoded data is indicated for output. Such corrected data is the same as data input at 2201.

With reference to FIG. 23-2, a decoding flow 2310 for the encoding example of FIG. 22 is described for an error injected into a first bit position a0[0] and a second bit position a0[1] of the encoded hex data at 2204. This error is injected by an XOR operation at 2311. This error may occur at any two adjacent bit locations due for example to an SEU or other bit upset event. The injection of this error is to illustrate how an error in data may be detected and corrected for a double adjacent bit error.

Encoded hex data with an error in a first bit position and a second bit position is indicated at 2312. At 2313, syndrome error data is generated for syndrome bits S[7:0]. This is a syndrome of encoded hex data of 2312, namely hex data 2204 with an error in the first and second bit positions. In this example, the syndrome space is 15, and the S7 bit is equal to 0. This syndrome is unique for adjacent bits a0[0] and a0[1] being in error, where the syndrome space for a0[0] is 5, and where the syndrome space for a0[1] is 10. As syndrome bit S7 equals 0, this means a double adjacent bit error has occurred.

At 2314, the bits at positions a0[0] and a0[1] are each flipped. At 2315, corrected decoded data is indicated or output. Such corrected data is the same as data input at 2201.

With reference to FIG. 23-3, a decoding flow 2320 for the encoding example of FIG. 22 is described for an error injected into a first bit position a0[0], a second bit position a0[1] and a third bit position a0[2] of the encoded hex data at 2204. This error is injected by an XOR operation at 2321. This error may occur at any three adjacent bit locations due for example to an SEU or other bit upset event. The injection of this error is to illustrate how an error in data may be detected but not corrected for a triple adjacent bit error.

Encoded hex data with an error in a first bit position, a second bit position, and a third bit position is indicated at 2322. At 2323, syndrome error data is generated for syndrome bits S[7:0]. This is a syndrome of encoded hex data of 2322, namely hex data 2204 with an error in the first, second and third bit positions. In this example, the syndrome space is 12, and the S7 bit is equal to 1. The S7 bit equal to 1 means an odd number of bits is/are in error. This syndrome is unique for adjacent bits a0[0], a0[1], and a0[2] being in error; however, it does not necessarily mean that adjacent bits a0[0], a0[1], and a0[2] are in error, as another 3 adjacent bit error in combination may have a syndrome space equal to 12. In other words, this indicates that a 3-adjacent bit error has occurred, but the bit locations are not uniquely known. Thus, at 2324, an indication of a detection of a three adjacent bit error is output; however, the corrupted data cannot be correct.

With reference to FIG. 24, an encoding flow 2400 is described. At 2401, 64-bit hex data is input. At 2402, the hex data at 2401 is converted to binary data 2402. At 2403, 8-bit parity data is generated for the binary data of 2402. The 8-bit parity data and the 64-bit binary data of 2402 is combined in an R-matrix format as previously described herein to provide 72-bit data. Such 72-bit data may be encoded in hex, as indicated at 2404, or may be encoded in binary, as indicated at 2404.

With reference to FIG. 25-1, a decoding flow 2500 for the encoding example of FIG. 24 is described for an error injected into a fifth bit position a0[4] of the encoded hex data at 2404. This error is injected by an XOR operation at 2501. This error may occur at any bit location due for example to an SEU or other bit upset event. The injection of this error is another example to illustrate how an error in data may be detected and corrected for a single bit error.

Encoded hex data with an error in a fifth bit position is indicated at 2502. At 2503, syndrome error data is generated for syndrome bits S[7:0]. This is a syndrome of encoded hex data of 2502, namely hex data 2404 with an error in the fifth bit position. In this example, the syndrome space is 14, and the S7 bit is equal to 1. This syndrome is unique for bit a0[4] being in error, where the syndrome space for a0[4] is 14. As syndrome bit S7 equals 1, this means a single bit error has occurred.

At 2504, the bit at position a0[4] is flipped. At 2505, corrected decoded data is indicated or output. Such corrected data is the same as data input at 2401.

With reference to FIG. 25-2, a decoding flow 2510 for the encoding example of FIG. 24 is described for an error injected into a fifth bit position a0[4] and a sixth bit position a0[5] of the encoded hex data at 2404. This error is injected by an XOR operation at 2511. Again, this error may occur at any two adjacent bit locations due for example to an SEU or other bit upset event. The injection of this error is to illustrate how an error in data may be detected and corrected for a double adjacent bit error.

Encoded hex data with an error in a fifth bit position and a sixth bit position is indicated at 2512. At 2513, syndrome error data is generated for syndrome bits S[7:0]. This is a syndrome of encoded hex data of 2512, namely hex data 2404 with an error in the fifth and sixth bit positions. In this example, the syndrome space is 31, and the S7 bit is equal to 0. This syndrome is unique for adjacent bits a0[4] and a0[5] being in error, where the syndrome space for a0[4] is 14, and where the syndrome space for a0[5] is 17. As syndrome bit S7 equals 0, this means a double adjacent bit error has occurred.

At 2514, the bits at positions a0[4] and a0[5] are each flipped. At 2515, corrected decoded data is indicated or output. Such corrected data is the same as data input at 2401.

With reference to FIG. 25-3, a decoding flow 2520 for the encoding example of FIG. 24 is described for an error injected into a fifth bit position a0[4], a sixth bit position a0[5] and a seventh bit position a0[6] of the encoded hex data at 2404. This error is injected by an XOR operation at 2521. This error may occur at any three adjacent bit locations due for example to an SEU or other bit upset event. The injection of this error is to illustrate how an error in data may be detected but not corrected for a triple adjacent bit error.

Encoded hex data with an error in a fifth bit position, a sixth bit position, and a seventh bit position is indicated at 2522. At 2523, syndrome error data is generated for syndrome bits S[7:0]. This is a syndrome of encoded hex data of 2522, namely hex data 2404 with an error in the fifth, sixth and seventh bit positions. In this example, the syndrome space is 22, and the S7 bit is equal to 1. The S7 bit equal to 1 means an odd number of bits is/are in error. This syndrome is unique for adjacent bits a0[4], a0[5], and a0[6] being in error; however, it does not necessarily mean that adjacent bits a0[4], a0[5], and a0[6] is in error, as another 3 adjacent bit error in combination may have a syndrome space equal to 22. In other words, this indicates that a 3-adjacent bit error has occurred, but the bit locations are not uniquely known. Thus, at 2524, an indication of a detection of a three adjacent bit error is output; however, the corrupted data cannot be correct.

With the above description borne in mind, it should be appreciated that no extra parity is used as compared with a conventional Hamming Code array for equal data size. Furthermore, if a 3-adjacent bit error is detected, decoding may be avoided.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
an encoder block coupled to receive input data;
wherein the encoder block has a first Kumar Rahul Code matrix ("R-matrix") block to provide a first block code matrix function;
wherein data bits and parity bits of the first R-Matrix are for writing to and reading from memory cells of a memory array; and
wherein the first R-matrix block is configured to:
exclusively OR (n−1) different combinations of subsets of the data bits of the input data to generate (n−1) parity bits of the parity bits for n a positive integer greater than zero;
exclusively OR a combination of all of the data bits and all the (n−1) parity bits to generate an (n) parity bit of the parity bits; and
provide encoded data by arrangement of the data bits and the (n−1) parity bits in an R-matrix format;
wherein:
the R-matrix format includes almost twice a number of rows with a same number of columns with respect to a Hamming Code configuration of the input data and the parity data; and
the R-matrix format has approximately a 9-to-7 ratio of occupied cells to unoccupied cells of the memory cells.

2. The apparatus according to claim 1, further comprising:
a decoder having a second Kumar Rahul Code matrix ("R-matrix") block to provide a second block code matrix function;
the second R-matrix block configured to:
exclusively OR the (n−1) different combinations of the subsets of the data bits respectively with an associated parity bit of the (n−1) parity bits to generate (n−1) syndrome bits; and
exclusively OR the combination of all of the data bits and all the (n) parity bits to generate an (n) syndrome bit.

3. The apparatus according to claim 2, wherein the decoder is configured to:
detect no bit in error;
detect and correct a single bit error;
detect a double bit error;
detect and correct a double adjacent bit error; and
detect a triple adjacent bit error.

4. The apparatus according to claim 2, wherein:
the second R-matrix block has a first syndrome, a second syndrome, and a third syndrome;
the first syndrome, the second syndrome, and the third syndrome are respectively associated with a single bit error space, a two adjacent bit error space, and a three adjacent bit error space;
the first syndrome and the second syndrome are configured to share a first common space;
the first syndrome and the third syndrome have mutually exclusive signatures; and
the third syndrome and the second syndrome are configured to share a second common space.

5. The apparatus according to claim 2, wherein the decoder is configured to provide a single bit error status, a double adjacent bit error status, and a triple adjacent bit error status.

6. An encoder, comprising:
a Kumar Rahul Code matrix ("R-matrix") block configured to generate parity data from input data with exclusive ORs;
wherein data bits and parity bits of the R-Matrix are for writing to and reading from memory cells of a memory array;
wherein the exclusive ORs are of combinations of:
(n−1) different subsets of data bits of the input data to generate (n−1) parity bits for n a positive integer greater than zero; and
all of the data bits and all the (n−I) parity bits to generate an (n) parity bit;
wherein the R-matrix block is further configured to:
arrange the input data as associated with a matrix format having approximately a 9-to-7 ratio of occupied cells to unoccupied cells of the memory cells;
wherein the matrix format includes increasing a number of rows while maintaining a same number of columns with respect to a Hamming Code configuration of the input data and the parity data;
distribute the input data throughout the matrix format in an out-of-sequence order with respect to an input order of the input data; and
populate the matrix format with the parity data generated.

7. The encoder according to claim 6, wherein the parity data does not change location with respect to the Hamming Code configuration.

8. The encoder according to claim 7, wherein distribution of the input data throughout the matrix format includes:
sets of data bits of the input data in sequences with at least one parity bit of the parity data placed in the middle of each of the sequences to provide singleton bits;
two adjacent bits of each of the sequences paired to provide bit pairs; and
three adjacent bits of each of the sequences of singleton bits concatenated to provide bit triplets.

9. The encoder according to claim 7, wherein distribution of the input data throughout the matrix format includes:
- two associated parity bits of the parity data placed in each of a plurality of sets of the input data to provide singleton bits;
- wherein the input data is in sequences of data bits;
- wherein the two associated parity bits for a first subset of the sequences of data bits are both placed in a middle of an associated sequence of the sequences;
- wherein the two associated parity bits for a second subset of the sequences of data bits have one of the two associated parity bits placed in the middle of the associated sequence and another one of the two associated parity bits placed at an end of the associated sequence;
- two adjacent bits of each of the sequences paired to provide bit pairs; and
- three adjacent bits of each of the sequences of singleton bits concatenated to provide bit triplets.

10. An apparatus, comprising:
- a memory for storing encoded data;
- a decoder coupled to the memory to receive the encoded data;
- wherein the decoder comprises a block code matrix function configured to:
- generate syndrome information from the encoded data; and
- decode the encoded data to provide decoded data;
- wherein the block code matrix function of the decoder is further configured to:
- detect and correct a double adjacent bit error; and
- detect a triple adjacent bit error;
- wherein the block code matrix function of the decoder has a first syndrome, a second syndrome, and a third syndrome;
- wherein the first syndrome, the second syndrome, and the third syndrome are respectively associated with a single bit error space, a two adjacent bit error space, and a three adjacent bit error space;
- wherein the first syndrome and the second syndrome are configured to share a first common space;
- wherein the first syndrome and the third syndrome have mutually exclusive signatures; and
- wherein the third syndrome and the second syndrome are configured to share a second common space;
- wherein:
  - the block code matrix function is configured to arrange data bits and parity bits of the encoded data in a matrix format to generate the syndrome information;
  - the data bits and parity bits are for writing to and reading from memory cells of a memory array;
  - to provide the syndrome information from the encoded data, the block code matrix function includes exclusive OR resources configured to exclusively OR:
    - (n−1) different combinations of subsets of the data bits and an associated parity bit of the parity bits from the matrix format to generate each bit(n−1) syndrome bit for n a positive integer greater than one; and
    - a combination of all of the data bits and all of the parity bits from the encoded data to generate a bit(n) syndrome bit; and
  - the matrix format includes a significantly greater number of rows with a same number of columns with respect to a Hamming Code configuration of the data bits and the parity bits; and
- wherein the matrix format has approximately a 9-to-7 ratio of occupied cells to unoccupied cells of the memory cells.

11. The apparatus according to claim 10, wherein the block code matrix function of the decoder is configured to:
- detect no bit in error;
- detect and correct a single bit error;
- detect a double bit error;
- detect and correct the double adjacent bit error; and
- detect the triple adjacent bit error.

12. The apparatus according to claim 11, wherein the decoder is configured to provide a single bit error status, a double adjacent bit error status, and a triple adjacent bit error status.

13. The apparatus according to claim 10, wherein the arrangement of the encoded data includes:
- sets of the data bits in sequences with at least one parity bit of the parity bits placed in the middle of each of the sequences to provide singleton bits;
- two adjacent bits of each of the sequences paired to provide bit pairs; and
- three adjacent bits of each of the sequences of singleton bits associated to provide bit triplets.

14. The apparatus according to claim 10, wherein the arrangement of the encoded data includes:
- two associated parity bits of the parity bits placed in each of a plurality of sets of the data bits to provide singleton bits;
- wherein the input data is in sequences of the data bits;
- wherein the two associated parity bits for a first subset of the sequences of the data bits are both placed in a middle of an associated sequence of the sequences;
- wherein the two associated parity bits for a second subset of the sequences of the data bits have one placed in the middle of the associated sequence and another one placed at an end of the associated sequence;
- two adjacent bits of each of the sequences paired to provide bit pairs; and
- three adjacent bits of each of the sequences of singleton bits concatenated to provide bit triplets.

* * * * *